(12) United States Patent
Lan et al.

(10) Patent No.: US 10,116,285 B2
(45) Date of Patent: *Oct. 30, 2018

(54) INTEGRATION OF A REPLICA CIRCUIT AND A TRANSFORMER ABOVE A DIELECTRIC SUBSTRATE

(71) Applicant: QUALCOMM Incorporated, San Diego, CA (US)

(72) Inventors: Je-Hsiung Lan, San Diego, CA (US); Chi Shun Lo, San Diego, CA (US); Jonghae Kim, San Diego, CA (US); Mario Francisco Velez, San Diego, CA (US); John H. Hong, San Clemente, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/410,223

(22) Filed: Jan. 19, 2017

(65) Prior Publication Data

US 2017/0134007 A1    May 11, 2017

Related U.S. Application Data

(62) Division of application No. 13/829,784, filed on Mar. 14, 2013, now Pat. No. 9,634,645.

(51) Int. Cl.
*H03H 11/28* (2006.01)
*H01L 27/12* (2006.01)
(Continued)

(52) U.S. Cl.
CPC ............. *H03H 11/28* (2013.01); *H01F 41/02* (2013.01); *H01L 23/5227* (2013.01);
(Continued)

(58) Field of Classification Search
CPC ................................. H03H 11/28; H01F 41/02
(Continued)

(56) References Cited

U.S. PATENT DOCUMENTS 3,798,059 A    3/1974   Astle et al.
4,815,128 A    3/1989   Malek
(Continued)

FOREIGN PATENT DOCUMENTS

CN    1601893 A    3/2005
CN    1628360 A    6/2005
(Continued)

OTHER PUBLICATIONS

Bhattacharya S.K., et al., "Fabrication of a Fully Integrated Passive Module for Filter Application Using Mcm-d Compatible Processes", Journal of Materials Science: Materials in Electronics, 2000, pp. 455-460.

(Continued)

*Primary Examiner* — Stephen E Jones
*Assistant Examiner* — Scott S Outten
(74) *Attorney, Agent, or Firm* — Qualcomm Incorporated-Toler

(57) ABSTRACT

A method includes forming a replica circuit above a surface of a glass-type material. The replica circuit includes a thin-film transistor (TFT) configured to function as a variable capacitor or a variable resistor. The method further includes forming a transformer above the surface of the glass-type material. The transformer is coupled to the replica circuit, and the transformer is configured to facilitate an impedance match between the replica circuit and an antenna.

18 Claims, 20 Drawing Sheets

(51) Int. Cl.

| | |
|---|---|
| *H01L 23/522* | (2006.01) |
| *H01L 23/66* | (2006.01) |
| *H01L 49/02* | (2006.01) |
| *H01F 41/02* | (2006.01) |
| *H01L 27/13* | (2006.01) |
| *H01L 23/64* | (2006.01) |
| *H01F 19/08* | (2006.01) |
| *H01F 27/28* | (2006.01) |

(52) U.S. Cl.
CPC .......... *H01L 23/66* (2013.01); *H01L 27/1218* (2013.01); *H01L 27/1255* (2013.01); *H01L 27/1259* (2013.01); *H01L 27/13* (2013.01); *H01L 28/10* (2013.01); *H01F 2019/085* (2013.01); *H01F 2027/2809* (2013.01); *H01L 23/645* (2013.01); *H01L 27/1225* (2013.01); *H01L 2223/6655* (2013.01); *H01L 2223/6672* (2013.01); *H01L 2223/6677* (2013.01); *H01L 2924/0002* (2013.01); *H01L 2924/30111* (2013.01)

(58) Field of Classification Search
USPC .............................................. 438/3; 333/32
See application file for complete search history.

(56) References Cited

U.S. PATENT DOCUMENTS

| | | | |
|---|---|---|---|
| 4,816,784 A | 3/1989 | Rabjohn | |
| 4,841,253 A | 6/1989 | Crabill | |
| 5,015,972 A | 5/1991 | Cygan et al. | |
| 5,038,104 A | 8/1991 | Wikswo, Jr. et al. | |
| 5,095,357 A | 3/1992 | Andoh et al. | |
| 5,111,169 A | 5/1992 | Ikeda | |
| 5,161,082 A | 11/1992 | Alfonso | |
| 5,719,073 A | 2/1998 | Shaw et al. | |
| 5,831,331 A | 11/1998 | Lee | |
| 5,959,846 A | 9/1999 | Noguchi et al. | |
| 5,986,617 A | 11/1999 | McLellan | |
| 6,025,261 A | 2/2000 | Farrar et al. | |
| 6,169,470 B1 | 1/2001 | Ibata et al. | |
| 6,429,763 B1 | 8/2002 | Patel et al. | |
| 6,437,965 B1 | 8/2002 | Adkins et al. | |
| 6,466,768 B1 | 10/2002 | Agahi-Kesheh et al. | |
| 6,501,363 B1 | 12/2002 | Hwu et al. | |
| 6,580,350 B1 | 6/2003 | Kobayashi | |
| 6,603,382 B1 | 8/2003 | Komai et al. | |
| 6,649,998 B2 | 11/2003 | Song | |
| 6,714,112 B2 | 3/2004 | Beng et al. | |
| 6,801,114 B2 | 10/2004 | Yang et al. | |
| 6,816,784 B1 | 11/2004 | Khan et al. | |
| 6,870,457 B2 | 3/2005 | Chen et al. | |
| 6,985,035 B1 | 1/2006 | Khorramabadi | |
| 6,990,729 B2 | 1/2006 | Pleskach et al. | |
| 7,064,411 B2 | 6/2006 | Hashizume et al. | |
| 7,304,558 B1 | 12/2007 | Pleskach et al. | |
| 7,312,685 B1 | 12/2007 | Lee | |
| 7,370,403 B1 | 5/2008 | Hsu et al. | |
| 7,486,168 B2 | 2/2009 | Kim | |
| 7,526,256 B2 | 4/2009 | Bhatti et al. | |
| 7,570,129 B2 | 8/2009 | Kintis et al. | |
| 7,592,891 B2 | 9/2009 | Hsu et al. | |
| 7,616,934 B2 | 11/2009 | MacPhail | |
| 7,619,297 B2 | 11/2009 | Wang | |
| 7,808,358 B2 | 10/2010 | Nakamura et al. | |
| 7,894,205 B2 | 2/2011 | Lee et al. | |
| 8,013,708 B2 | 9/2011 | Tsai | |
| 8,045,946 B2 | 10/2011 | Roo et al. | |
| 8,229,367 B2 | 7/2012 | Chan et al. | |
| 8,233,870 B2 | 7/2012 | Walley et al. | |
| 8,339,233 B2 | 12/2012 | Tsai et al. | |
| 8,354,325 B1 | 1/2013 | Dao et al. | |
| 8,368,481 B2 | 2/2013 | Jin et al. | |
| 8,493,126 B2 | 7/2013 | Sankaranarayanan et al. | |
| 8,591,262 B2 | 11/2013 | Schaffer et al. | |
| 9,001,031 B2 | 4/2015 | Lo et al. | |
| 9,431,473 B2 | 8/2016 | Lo et al. | |
| 9,449,753 B2 | 9/2016 | Kim et al. | |
| 2002/0057176 A1 | 5/2002 | Norstrom et al. | |
| 2002/0113682 A1 | 8/2002 | Gevorgian et al. | |
| 2002/0132383 A1 | 9/2002 | Hiroki et al. | |
| 2003/0151485 A1 | 8/2003 | Lewis | |
| 2004/0012474 A1 | 1/2004 | Hwu et al. | |
| 2004/0090298 A1 | 5/2004 | Masu et al. | |
| 2004/0104449 A1 | 6/2004 | Yoon et al. | |
| 2004/0150502 A1 | 8/2004 | Jacobson et al. | |
| 2004/0207504 A1 | 10/2004 | Yang et al. | |
| 2005/0003199 A1 | 1/2005 | Takaya et al. | |
| 2005/0104158 A1 | 5/2005 | Bhattacharjee et al. | |
| 2006/0017539 A1 | 1/2006 | Lee et al. | |
| 2006/0284719 A1 | 12/2006 | Lee | |
| 2007/0008058 A1 | 1/2007 | Hashimoto | |
| 2007/0030116 A1 | 2/2007 | Feher | |
| 2007/0152298 A1 | 7/2007 | Kim | |
| 2007/0176845 A1 | 8/2007 | Yamazaki et al. | |
| 2007/0188997 A1 | 8/2007 | Hockanson et al. | |
| 2007/0247269 A1 | 10/2007 | Papananos | |
| 2007/0249078 A1 | 10/2007 | Tung et al. | |
| 2008/0037590 A1 | 2/2008 | Aiga et al. | |
| 2008/0076354 A1 | 3/2008 | Rofougaran | |
| 2008/0169895 A1 | 7/2008 | Lee | |
| 2008/0174386 A1 | 7/2008 | Ono et al. | |
| 2008/0174396 A1 | 7/2008 | Choi et al. | |
| 2008/0174397 A1 | 7/2008 | De Rooij et al. | |
| 2008/0246114 A1 | 10/2008 | Abrokwah et al. | |
| 2008/0272875 A1 | 11/2008 | Huang et al. | |
| 2008/0303622 A1 | 12/2008 | Park et al. | |
| 2009/0001510 A1 | 1/2009 | Matz et al. | |
| 2009/0072404 A1 | 3/2009 | Kikuchi et al. | |
| 2009/0085708 A1 | 4/2009 | Matsumoto et al. | |
| 2009/0134955 A1* | 5/2009 | Sheng ..................... H03J 1/005 333/174 |
| 2009/0146770 A1 | 6/2009 | Lee et al. | |
| 2009/0243389 A1 | 10/2009 | Edo et al. | |
| 2009/0243749 A1 | 10/2009 | Rofougaran | |
| 2009/0322447 A1 | 12/2009 | Daley et al. | |
| 2009/0322458 A1 | 12/2009 | Lee et al. | |
| 2010/0060402 A1 | 3/2010 | Chen | |
| 2010/0096753 A1 | 4/2010 | Hwang et al. | |
| 2010/0109123 A1 | 5/2010 | Strzalkowski et al. | |
| 2010/0148866 A1 | 6/2010 | Lee et al. | |
| 2010/0164667 A1 | 7/2010 | Ho-Hsiang | |
| 2010/0182118 A1 | 7/2010 | Roskos et al. | |
| 2010/0225435 A1 | 9/2010 | Li et al. | |
| 2010/0231305 A1 | 9/2010 | Mizokami et al. | |
| 2010/0260082 A1 | 10/2010 | Lum et al. | |
| 2010/0270947 A1 | 10/2010 | Chang et al. | |
| 2011/0018670 A1 | 1/2011 | Bae et al. | |
| 2011/0050357 A1 | 3/2011 | Kim et al. | |
| 2011/0102124 A1 | 5/2011 | Matsushita | |
| 2011/0133875 A1 | 6/2011 | Chiu et al. | |
| 2011/0133879 A1 | 6/2011 | Chiu et al. | |
| 2011/0168997 A1 | 7/2011 | Lee et al. | |
| 2011/0210804 A1* | 9/2011 | Uemichi ............ H01L 23/49822 333/26 |
| 2011/0217657 A1 | 9/2011 | Flemming et al. | |
| 2011/0221560 A1 | 9/2011 | Chen et al. | |
| 2011/0229667 A1 | 9/2011 | Jin et al. | |
| 2011/0229687 A1 | 9/2011 | Gu et al. | |
| 2011/0234469 A1 | 9/2011 | Shoji | |
| 2011/0245948 A1 | 10/2011 | Bai et al. | |
| 2011/0291786 A1 | 12/2011 | Li et al. | |
| 2011/0299431 A1 | 12/2011 | Mikhemar et al. | |
| 2011/0299435 A1 | 12/2011 | Mikhemar et al. | |
| 2011/0304013 A1 | 12/2011 | Chen et al. | |
| 2012/0058676 A1 | 3/2012 | Schaffer et al. | |
| 2012/0075216 A1 | 3/2012 | Black et al. | |
| 2012/0146741 A1 | 6/2012 | Yen et al. | |
| 2012/0188047 A1 | 7/2012 | Groves et al. | |
| 2012/0194403 A1 | 8/2012 | Cordier et al. | |
| 2012/0235779 A1 | 9/2012 | Baram et al. | |
| 2012/0235969 A1 | 9/2012 | Burns et al. | |
| 2012/0238331 A1 | 9/2012 | Dou et al. | |

(56) References Cited

U.S. PATENT DOCUMENTS

| | | |
|---|---|---|
| 2012/0244802 A1 | 9/2012 | Feng et al. |
| 2012/0249186 A1 | 10/2012 | Chen |
| 2012/0249281 A1 | 10/2012 | Campbell et al. |
| 2012/0293485 A1 | 11/2012 | Chang et al. |
| 2012/0299166 A1 | 11/2012 | Minamio et al. |
| 2013/0016633 A1 | 1/2013 | Lum et al. |
| 2013/0039229 A1 | 2/2013 | Park et al. |
| 2013/0050226 A1 | 2/2013 | Shenoy et al. |
| 2013/0057343 A1 | 3/2013 | Kondo |
| 2013/0057557 A1 | 3/2013 | Shenoy et al. |
| 2013/0106554 A1 | 5/2013 | Girard et al. |
| 2013/0157717 A1 | 6/2013 | Yu et al. |
| 2013/0207276 A1 | 8/2013 | Tseng et al. |
| 2013/0207739 A1 | 8/2013 | Bakalski |
| 2013/0207745 A1 | 8/2013 | Yun et al. |
| 2013/0257367 A1 | 10/2013 | Someya |
| 2013/0278374 A1 | 10/2013 | Thorslund |
| 2014/0145810 A1 | 5/2014 | Park et al. |
| 2014/0197902 A1 | 7/2014 | Zuo et al. |
| 2014/0225702 A1 | 8/2014 | Yazaki |
| 2014/0227982 A1 | 8/2014 | Granger-Jones et al. |
| 2014/0240072 A1 | 8/2014 | Lan et al. |
| 2014/0266494 A1 | 9/2014 | Lan et al. |
| 2014/0293841 A1 | 10/2014 | Rousu |
| 2014/0307599 A1 | 10/2014 | Rousu |
| 2014/0327510 A1 | 11/2014 | Kim et al. |
| 2015/0092314 A1 | 4/2015 | Kim et al. |
| 2015/0130579 A1 | 5/2015 | Kim et al. |
| 2015/0194944 A1 | 7/2015 | Joshi et al. |
| 2015/0304059 A1 | 10/2015 | Zuo et al. |
| 2016/0358709 A1 | 12/2016 | Kim et al. |

FOREIGN PATENT DOCUMENTS

| | | |
|---|---|---|
| CN | 1893071 A | 1/2007 |
| CN | 101213142 A | 7/2008 |
| CN | 101241916 A | 8/2008 |
| CN | 201156721 Y | 11/2008 |
| CN | 101673864 A | 3/2010 |
| CN | 101960573 A | 1/2011 |
| CN | 102231313 A | 11/2011 |
| CN | 102522181 A | 6/2012 |
| CN | 102725844 A | 10/2012 |
| CN | 102739229 A | 10/2012 |
| CN | 203942319 U | 11/2014 |
| EP | 0468757 A2 | 1/1992 |
| EP | 0995264 A1 | 4/2000 |
| EP | 1085538 A1 | 3/2001 |
| EP | 1443529 A1 | 8/2004 |
| EP | 1729413 A1 | 12/2006 |
| JP | H0832076 A | 2/1996 |
| JP | H08148354 A | 6/1996 |
| JP | H1050522 A | 2/1998 |
| JP | H10144552 A | 5/1998 |
| JP | H11204730 A | 7/1999 |
| JP | 2000114046 A | 4/2000 |
| JP | 2000286125 A | 10/2000 |
| JP | 2002152901 A | 5/2002 |
| JP | 2003031814 A | 1/2003 |
| JP | 2003318417 A | 11/2003 |
| JP | 2004235584 A | 8/2004 |
| JP | 2005032976 A | 2/2005 |
| JP | 2005223261 A | 8/2005 |
| JP | 2006019506 A | 1/2006 |
| JP | 2006054446 A | 2/2006 |
| JP | 2006228747 A | 8/2006 |
| JP | 2007150022 A | 6/2007 |
| JP | 2008177566 A | 7/2008 |
| JP | 2009038297 A | 2/2009 |
| JP | 2009507426 A | 2/2009 |
| JP | 2009508322 A | 2/2009 |
| JP | 2009071045 A | 4/2009 |
| JP | 2009246159 A | 10/2009 |
| JP | 2010016337 A | 1/2010 |
| JP | 2010098199 A | 4/2010 |
| JP | 2010141246 A | 6/2010 |
| JP | 2011029222 A | 2/2011 |
| JP | 2012058274 A | 3/2012 |
| JP | 2012074060 A | 4/2012 |
| JP | 2012164770 A | 8/2012 |
| KR | 20060007618 A | 1/2006 |
| KR | 20080031153 A | 4/2008 |
| KR | 20080069823 A | 7/2008 |
| KR | 101127478 B1 | 3/2012 |
| KR | 20130072284 A | 7/2013 |
| KR | 20130098099 A | 9/2013 |
| WO | 02080279 A1 | 10/2002 |
| WO | 2011153162 | 12/2011 |
| WO | 2012093133 A1 | 7/2012 |
| WO | 2013033124 A1 | 3/2013 |

OTHER PUBLICATIONS

Liu L., et al., "Compact Harmonic Filter Design and Fabrication Using IPD Technology", IEEE Transactions on components and packaging technologies, vol. 30 (4), 2007, pp. 556-562.

Bae H., et al., "Extraction of Separated Source and Drain Resistances in Amorphous Indium-Gallium-Zinc Oxide TFTs Through C—V Characterization", IEEE Electron Device Letters, Jun. 2011, vol. 32, No. 6, pp. 761-763.

Chien-Hsun Chen et al., "Very Compact Transformer-Coupled Balun-Integrated Bandpass Filter Using Integrated Passive Device Technology on Glass Substrate", Microwave Symposium Digest (MTT), 2010 IEEE MTT-S International, May 23-28, 2010, pp. 1372-1375.

Fu et al., "A Ferroelectric-Based Impedance Tuner for Adaptive Matching Applications", Microwave Symposium Digest, 2008 IEEE MTT-S International, Jun. 15-20, 2008, pp. 955-958.

International Search Report and Written Opinion—PCT/US2014/021904—ISA/EPO—dated Jun. 3, 2014.

Mikhemar, et al., "An On-Chip Wideband and Low-Loss Duplexer for 3G/4G CMOS Radios," IEEE Symposium on VLSI Circuits 2010, pp. 129-130.

Mikhemar M. et al., "A tunable integrated duplexer with 50dB isolation in 40nm CMOS", IEEE International Solid-State Circuits Conference (ISSCC)—Digest of Technical Papers, Feb. 8, 2009, IEEE, Piscataway, NJ, USA, pp. 386-387,387a, XP031742309, ISBN: 978-1-4244-3458-9.

Mobley, T., et al., "Through glass via (TGV) solutions for wafer and chip level interposers and RF integration methods for high frequency applications," Mar. 2012, 25 pages.

Orlandi S., et al., "Optimization of shielded PCB air-core toroids for high efficiency dc-dc converters," Energy Conversion Congress and Exposition, Sep. 2009, pp. 2073-2080.

Saputra N., et al., "Single-Grain Si Thin-Film Transistors for Analog and RF Circuit Applications", Solid State Device Research Conference, ESSDERC 2007, 37th Europea,Sep. 11-13, 2007, pp. 107-110.

Shorey, A., et al., "Development of Substrates Featuring Through Glass Vias (TGV) for 3D-IC Integration," pp. 1-3.

Topper M. et al., "3-D Thin film interposer based on TGV (Through Glass Vias): An alternative to Si-interposer", Electronic Components and Technology Conference (ECTC), 2010 Proceedings 60th, IEEE, Piscataway, NJ, USA, Jun. 1, 2010 (Jun. 1, 2010), pp. 66-73, XP031694110, ISBN: 978-1-4244-6410-4.

Yoon Y. et al., "Design and Characterization of Multilayer Spiral Transmission-Line Baluns", IEEE Transactions on Microwave Theory and Techniques, Sep. 1, 1999, IEEE Service Center, Piscataway, NJ, US, vol. 47, No. 9, pp. 1841-1847, XP011037747, ISSN: 0018-9480.

Yu X., et al., "Silicon-Embedding Approaches to 3-D Toroidal Inductor Fabrication," Journal of Microelectromechanical Systems, Jun. 2013, vol. 22 (3), pp. 580-588.

\* cited by examiner

INTEGRATION OF A REPLICA CIRCUIT AND A TRANSFORMER ABOVE A DIELECTRIC SUBSTRATE

I. CROSS REFERENCE TO RELATED APPLICATIONS

The present application claims priority from and is a divisional application of pending U.S. patent application Ser. No. 13/829,784, filed Mar. 14, 2013, entitled "INTEGRATION OF A REPLICA CIRCUIT AND A TRANSFORMER ABOVE A DIELECTRIC SUBSTRATE," the content of which is incorporated by reference herein in its entirety.

II. FIELD

The present disclosure is generally related to replica circuits and transformers in semiconductor devices.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Numerous technical breakthroughs have been realized in the field of wireless communication technology. One technical breakthrough is in semiconductor manufacturing processes that enable integration of a large number of microelectronic devices in a semiconductor integrated circuit (IC). Semiconductor manufacturing technology has reduced the costs associated with manufacturing wireless communication products.

Complementary-Metal-Oxide-Semiconductor (CMOS) manufacturing technology may be used in manufacturing wireless communication ICs. Because radio-frequency (RF) duplexers use frequency-selective filters for transmit-receive (TX-RX) isolation, high isolation requirements make integration of the RF off-chip duplexers with CMOS technology difficult. Surface Acoustic Wave (SAW) technology and Film Bulk Acoustic Resonator (FBAR) technology may be used in RF duplexers to provide TX-RX isolation. However, SAW and FBAR technologies may result in relatively large module sizes and higher costs as compared to other technologies.

IV. SUMMARY

This disclosure presents particular embodiments of a system that integrates a replica circuit coupled to a transformer. The replica circuit and the transformer are disposed above a dielectric substrate to achieve an impedance match between the replica circuit and an antenna and to provide transmit-receive (TX-RX) isolation.

In a particular embodiment, a device includes a replica circuit disposed above a dielectric substrate. The replica circuit includes a thin film transistor (TFT) configured to function as a variable capacitor or a variable resistor. The device further includes a transformer disposed above the dielectric substrate and coupled to the replica circuit. The transformer is configured facilitate an impedance match between the replica circuit and an antenna.

In another particular embodiment, a method includes forming a replica circuit above a surface of a glass-type material. The replica circuit includes a TFT configured to function as a variable capacitor or a variable resistor. The method further includes forming a transformer above the surface of the glass-type material. The transformer is coupled to the replica circuit. The transformer is configured to facilitate an impedance match between the replica circuit and an antenna.

In another particular embodiment, a device includes means for impedance matching disposed above a dielectric substrate. The means for impedance matching includes a TFT configured to function as a variable capacitor or a variable resistor. The device further includes means for transferring energy disposed above the dielectric substrate and coupled to the means for impedance matching. The means for transferring energy is configured to facilitate an impedance match between the means for impedance matching and an antenna.

In another particular embodiment, a method includes a first step for forming a replica circuit above a surface of a glass-type material. The replica circuit includes a TFT configured to function as a variable capacitor or a variable resistor. The method further includes a second step for forming a transformer above the surface of the glass-type material. The transformer is coupled to the replica circuit. The transformer is configured to facilitate an impedance match between the replica circuit and an antenna.

In another particular embodiment, a non-transitory computer readable medium includes instructions that, when executed by a processor, cause the processor to initiate formation of a replica circuit above a surface of a glass-type material. The replica circuit includes a TFT configured to function as a variable capacitor or a variable resistor. The non-transitory computer readable medium further includes instructions that, when executed by a processor, cause the processor to initiate formation of a transformer above the surface of the glass-type material. The transformer is coupled to the replica circuit. The transformer is configured to facilitate an impedance match between the replica circuit and an antenna.

In another particular embodiment, a method includes receiving a data file including design information corresponding to a semiconductor device. The method further includes fabricating the semiconductor device according to the design information. The semiconductor device includes a replica circuit disposed above a dielectric substrate. The replica circuit includes a TFT configured to function as a variable capacitor or a variable resistor. The semiconductor device further includes a transformer disposed above the dielectric substrate and coupled to the replica circuit. The transformer is configured to facilitate an impedance match between the replica circuit and an antenna.

One particular advantage provided by at least one of the disclosed embodiments is that integration of a replica circuit and a transformer above the same dielectric substrate may reduce trace inductance variation between the replica circuit and the transformer. The trace inductance variation could result in an impedance mismatch between the replica circuit and an antenna, reducing transmit-receive (TX-RX) isolation. Fabricating the replica circuit and the transformer above the same dielectric substrate may achieve impedance match between the replica circuit and the antenna, improving the TX-RX isolation.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
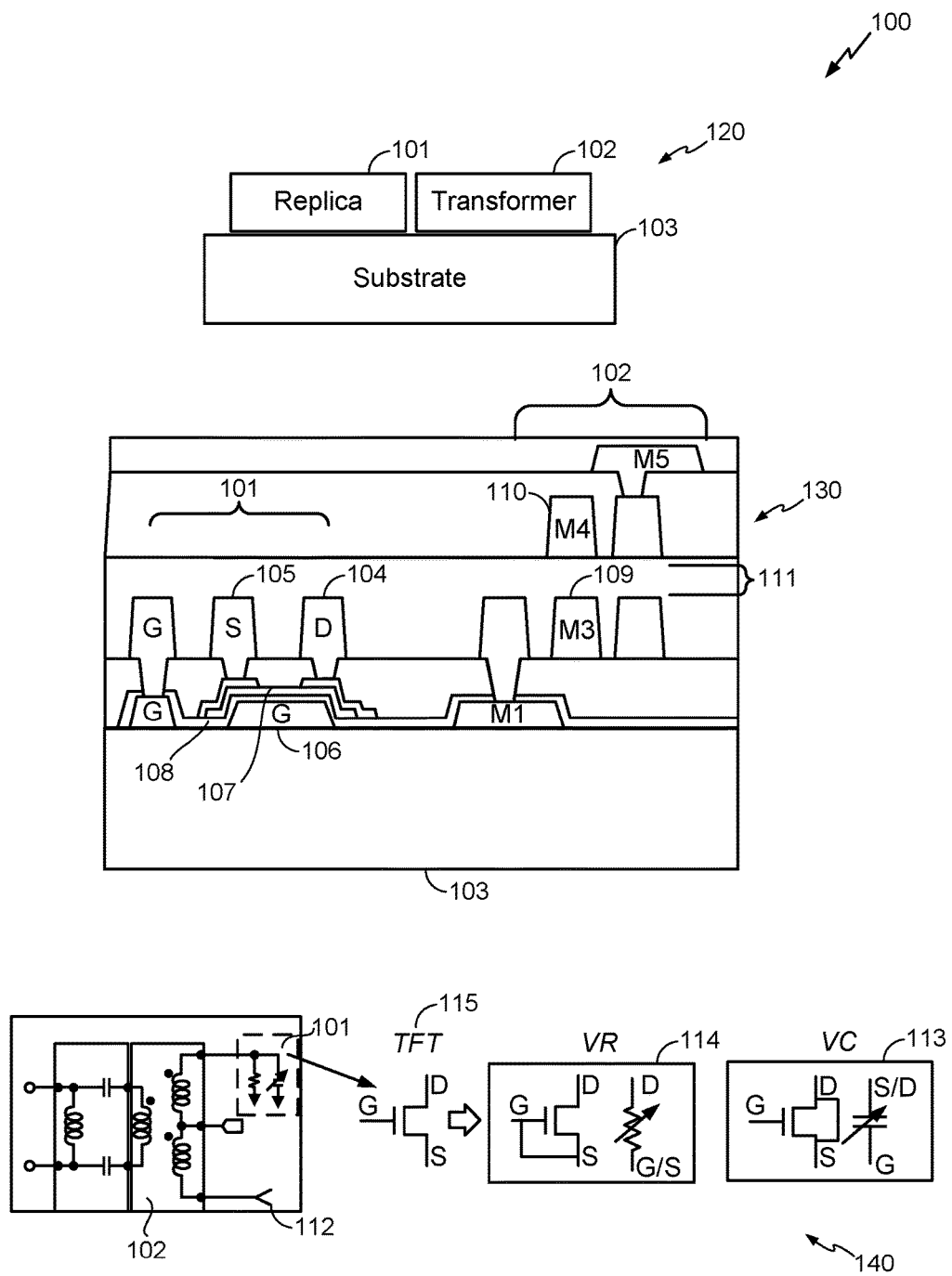
FIG. 1 is a diagram showing a particular embodiment of a structure that includes a replica circuit disposed side-by-side with a transformer above a substrate.

FIG. 1 is a diagram showing an embodiment of a structure 100 that includes a replica circuit 101 fabricated side-by-side with a transformer 102 above a dielectric substrate 103 (e.g., a glass-type material, such as a passive-on-glass (POG) substrate). FIG. 1 shows the structure 100 in a functional block view 120, a cross section view 130, and a circuit level view 140.

In a particular embodiment, the replica circuit 101 includes a thin-film transistor (TFT) 115. The TFT 115 includes a drain region 104, a source region 105, a gate region 106, a channel region 107, and a gate-insulating layer 108. In a particular embodiment, the transformer 102 is a vertical-coupling hybrid transformer (VHT). In another embodiment, the transformer 102 is a lateral-coupling hybrid transformer. When the transformer 102 is a VHT, the transformer 102 may include a first inductor structure (e.g., a first inductor 109) disposed above the surface of a dielectric substrate (e.g., the dielectric substrate 103 of FIG. 1), a second inductor structure (e.g., a second inductor 110) disposed above the dielectric structure and the first inductor structure, and a dielectric layer (e.g., dielectric layer 111) disposed between the first inductor structure and the second inductor structure. The term "above" as used herein should be interpreted as being relative to the orientation shown in the figures presented herein. The transformer 102 may further include an air-gap disposed between the first inductor structure and the second inductor structure. When the transformer 102 is a lateral-coupling hybrid transformer, the transformer 102 may include a first inductor structure disposed above a surface of a dielectric substrate (e.g., the dielectric substrate 103 of FIG. 1) and a second inductor structure disposed above the surface of the dielectric substrate, where the first inductor structure and the second inductor structure are side-by-side.

As illustrated in FIG. 1, one terminal of the transformer 102 may be coupled to the replica circuit 101 and another terminal of the transformer 102 may be coupled to an antenna 112. The TFT 115 may be configured to function as a variable capacitor 113 or a variable resistor 114 to achieve an impedance match, or a substantial or near impedance match, between the antenna 112 and the replica circuit 101. The transformer 102 may be configured to facilitate an impedance match, or a substantial or near impedance match, between the replica circuit 101 and the antenna 112. In a particular embodiment, the source region 105 of the TFT 115 is coupled to the drain region 104 to form the variable capacitor 113. In a particular embodiment, the gate region 106 is coupled to the source region 105 to form the variable resistor 114.

Figure 2:
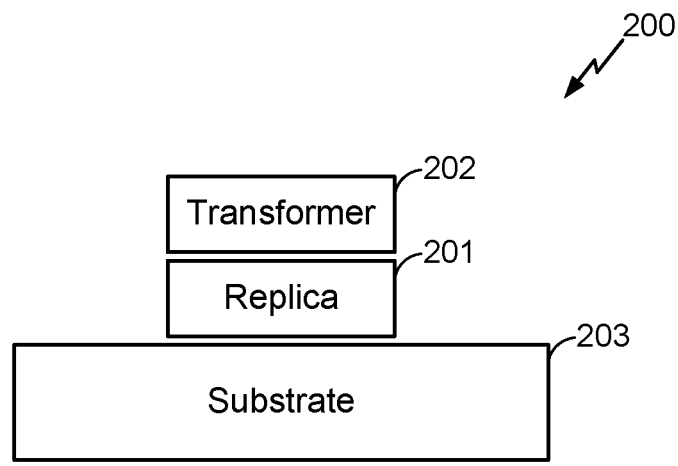
FIG. 2 is a diagram showing a particular embodiment of a structure that includes a replica circuit disposed below a transformer above a substrate.

FIG. 2 depicts an embodiment of a structure 200 that includes a replica circuit 201 fabricated with a transformer 202 above a dielectric substrate 203 (e.g., a glass-type material, such as a passive-on-glass (POG) substrate), where the transformer 202 is disposed above the replica circuit 201. FIG. 2 shows the structure 200 in a high functional block diagram view. A circuit level view of the structure 200 may correspond to the circuit level view 140 of FIG. 1.

In a particular embodiment, the replica circuit 201 includes a thin-film transistor (TFT). The TFT replica circuit 201 may include a drain region, a source region, a gate region, a channel region, and a gate-insulating layer. The transformer 202 may be a vertical-coupling hybrid transformer (VHT) or a lateral-coupling hybrid transformer. When the transformer 202 is a VHT, the transformer 202 may include a first inductor structure disposed above the surface of a dielectric substrate (e.g., the dielectric substrate 203), a second inductor structure disposed above the dielectric structure and the first inductor structure, and a dielectric layer disposed between the first inductor structure and the second inductor structure. The transformer 202 may further include an air-gap disposed between the first inductor structure and the second inductor structure. When the transformer 202 is a lateral-coupling hybrid transformer, the transformer 202 may include a first inductor structure disposed above a surface of a dielectric substrate and a second inductor structure disposed above the surface of the dielectric substrate, where the first inductor structure and the second inductor structure are side-by-side.

Figure 3:
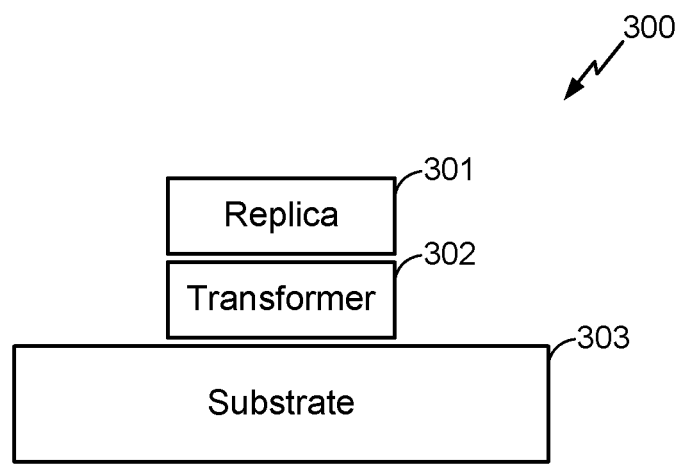
FIG. 3 is a diagram showing a particular embodiment of a structure that includes a replica circuit disposed above a transformer above a substrate.

FIG. 3 depicts an embodiment of a structure 300 that includes a replica circuit 301 fabricated with a transformer 302 above a dielectric substrate 303 (e.g., a glass-type material, such as a passive-on-glass (POG) substrate), where the replica circuit 301 is disposed above the transformer 302. FIG. 3 shows a functional block view of the structure 300. A circuit level view of the structure 300 may correspond to the circuit level view 140 of FIG. 1.

In a particular embodiment, the replica circuit 301 includes a thin-film transistor (TFT). The TFT replica circuit 301 may include a drain region, a source region, a gate region, a channel region, and a gate-insulating layer. The transformer 302 may be a vertical-coupling hybrid transformer (VHT) or a lateral-coupling hybrid transformer. When the transformer 302 is a VHT, the transformer 302 may include a first inductor structure disposed above the surface of a dielectric substrate (e.g., the dielectric substrate 303), a second inductor structure disposed above the dielectric structure and the first inductor structure, and a dielectric layer disposed between the first inductor structure and the second inductor structure. The transformer 302 may further include an air-gap disposed between the first inductor structure and the second inductor structure. When the transformer 302 is a lateral-coupling hybrid transformer, the transformer 302 may include a first inductor structure disposed above a surface of a dielectric substrate and a second inductor structure disposed above the surface of the dielectric substrate, where the first inductor structure and the second inductor structure are disposed side-by-side.

Fabricating a replica circuit and a transformer above a dielectric substrate, as illustrated in any of FIGS. 1-3, may reduce a trace inductance variation between the replica circuit and the transformer. The trace inductance variation could result in an impedance mismatch between the replica circuit and an antenna (e.g., the antenna 112 of FIG. 1), reducing transmit-receive (TX-RX) isolation. Fabricating the replica circuit and the transformer above the dielectric substrate may achieve an impedance match, or a substantial or near impedance match, between the replica circuit and the antenna, improving the TX-RX isolation.

The following description provides details of a particular embodiment of a method of fabricating a device including a replica circuit side-by-side with a transformer (as depicted in FIG. 1). The features, methods, and structures described may be used to fabricate devices in which the replica circuit is above the transformer or the transformer is above the replica circuit, as illustrated in FIG. 2 and FIG. 3, respectively.

Figure 4:
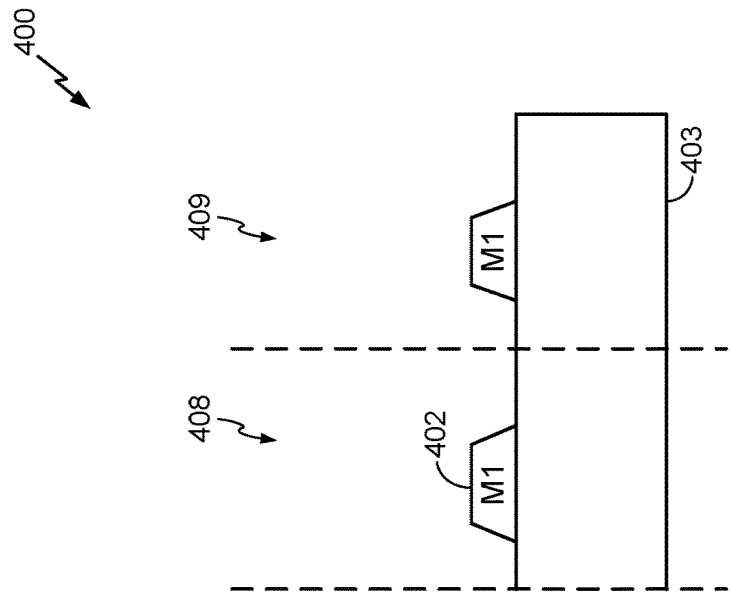
FIG. 4 is a diagram of a first illustrative diagram of a structure during at least one stage in a process of fabricating a semiconductor device.
Figure 4:
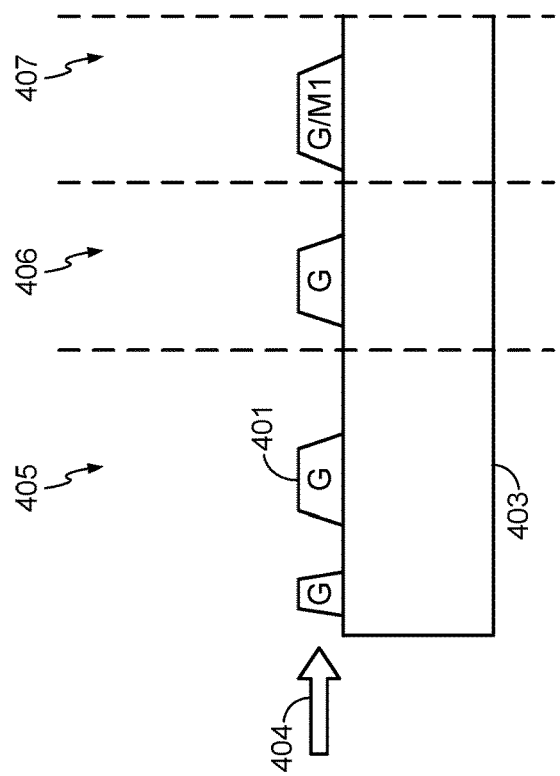

Referring to FIG. 4, a first illustrative diagram of a structure as formed during at least one stage in a process of fabricating a semiconductor device is depicted and generally designated 400. FIG. 4 shows a gate region 401 of a TFT of a replica circuit and metal connectors 402 of a transformer. The diagram shows a cross-sectional view of a portion of the structure 400. The structure 400 may include a dielectric material as a substrate 403. In an embodiment, the substrate 403 may include or be formed from a glass-type material (e.g., a non-crystalline or amorphous solid material) with a high electrical resistivity, from wide bandgap semiconductors, or from a plastic substrate with a high electrical resistivity. Examples of the glass-type material include alkaline earth boro-aluminosilicate (e.g., Corning glass substrate). Gallium Arsenide (GaAs), Indium phosphate (InP), silicon carbide (SiC), Rogers Laminates, and polymers such as plastics and epoxies. In another embodiment, the substrate 403 may include or be formed from a crystalline material with high electrical resistivity, such as sapphire ($Al_2O_3$), quartz, or ceramics. In a particular embodiment, the thickness of the substrate 403 is in a range of about 0.3 mm to about 0.7 mm.

FIG. 4 is divided into several regions 405-409. Each region 405-409 illustrates the formation of a different device in FIGS. 4-14. For example, region 405 illustrates the formation of a TFT, such as the TFT 115 of FIG. 1. Region 406 illustrates the formation of a TFT configured to function as a variable resistor, such as the variable resistor 114 of FIG. 1. Region 407 illustrates the formation of a TFT configured to function as a variable capacitor, such as the variable capacitor 113 of FIG. 1. Region 408 illustrates the formation of a lateral-coupling hybrid transformer. Region 409 illustrates the formation of a vertical-coupling hybrid transformer. The regions 405-409 may be arranged in any configuration that includes at least one transformer and at least one TFT configuration, where the TFT is used as a replica circuit.

The gate region 401 and the metal connectors 402 may be formed using additive processes. Various processes may be used to apply, remove, or pattern layers. For example, film deposition processes, such as chemical vapor deposition (CVD), spin-on, sputtering, and electroplating can be used to form metal layers and inter-metal dielectric layers; photolithography can be used to form patterns of metal layers; etching process can be performed to remove unwanted materials; and planarization processes such as spin-coating, "etch-back," and chemical-mechanical polishing (CMP) can be employed to create a flat surface. Other processes may also or in the alternative be used depending on materials to be added, removed, patterned, doped, or otherwise fabricated.

Additionally, only a limited number of connectors, inductors, layers, and other structures or devices are shown in the figures to facilitate illustration and for clarity of the description. In practice, the structure may include more or fewer connectors, inductors, layers, and other structures or devices.

A conductive layer 404 may be deposited above the substrate 403 to form the gate region 401 of the TFT of the replica circuit and the metal connectors 402. The metal connectors 402 may be utilized to connect or to form inductors of the transformer (such as the transformer 102 of FIG. 1). In a particular embodiment, the conductive layer 404 includes a metal, such as aluminum (Al), molybdenum (Mo), or copper (Cu), or a metal alloy, such as aluminum-copper alloy (Al—Cu), aluminum-neodymium (Al—Nd), aluminum-tantalum (Al—Ta), or aluminum-silicon-copper (AlSiCu), or a combination thereof. In a particular embodiment, the thickness of the conductive layer 404 is about 1 micrometer (μm). The conductive layer 404 may be formed using additive processes, such as chemical vapor deposition (CVD), spin-on, sputtering, or electroplating. A photolithography-etch process may be used to pattern the gate region 401 and the metal connectors 402.

Figure 5:
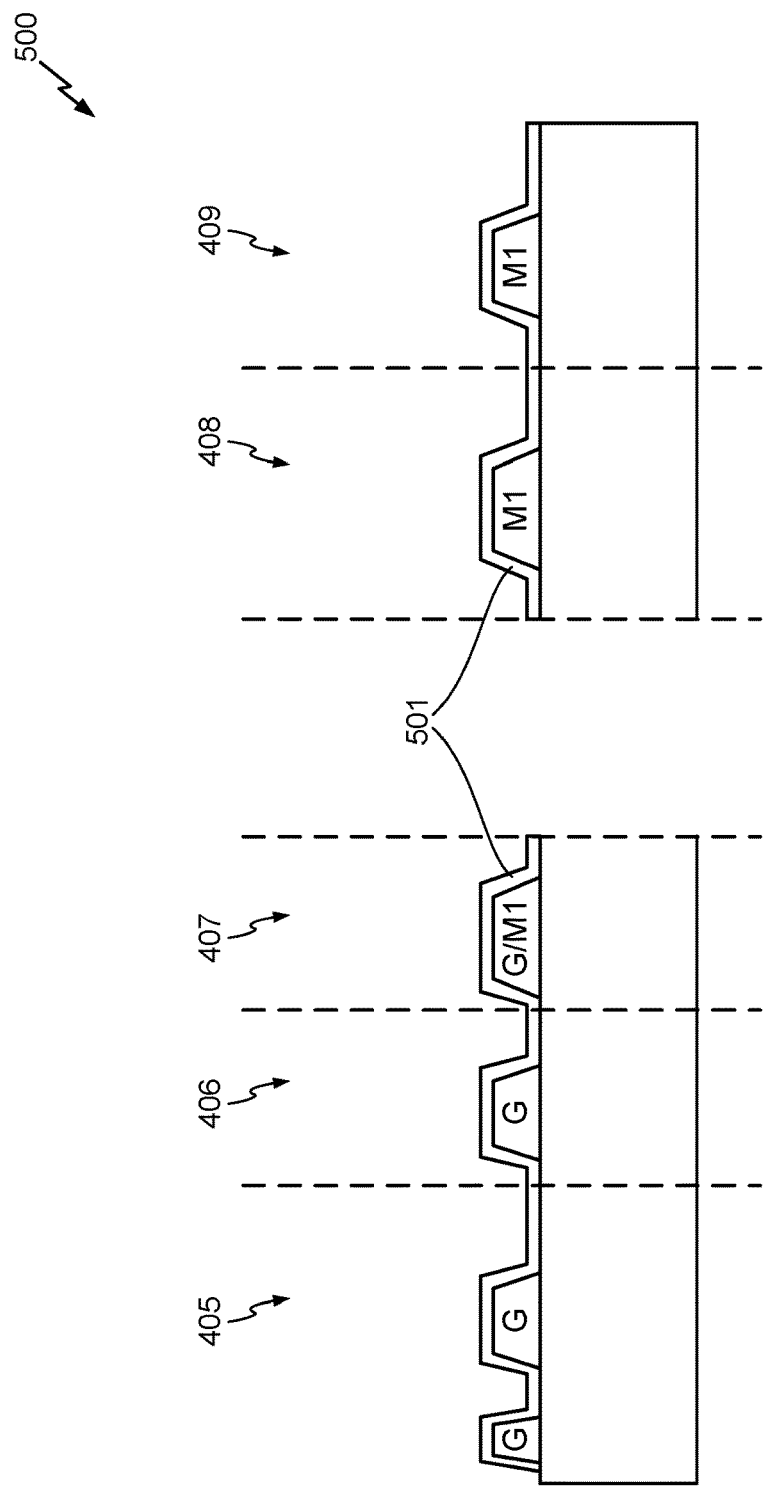
FIG. 5 is a diagram of a second illustrative diagram of a structure during at least one stage in the process of fabricating a semiconductor device.

Referring to FIG. 5, a second illustrative diagram of a structure formed during at least one stage in the process of fabricating a semiconductor device is depicted and generally designated 500. In FIG. 5, after the gate region 401 and the metal connectors 402 are formed, an insulation layer 501 is formed above the substrate 403 to insulate the gate region 401 from a subsequently formed drain region, source region, and channel region of the TFT of the replica circuit. The insulation layer 501 may be composed of a dielectric insulator material, such as silicon dioxide ($SiO_2$), silicon nitride ($Si_3N_4$), aluminum oxide ($Al_2O_3$), tantalum pentoxide ($Ta_2O_5$) or another material suitable for insulating the gate region 401 from the drain region, the source region, and the channel region. The insulation layer 501 may be formed through film deposition processes, such as (i) plasma-enhanced chemical vapor deposition (PE-CVD) for $SiO_x$ and $SiN_x$ (ii) atomic layer deposition (ALD) for $Al_2O_3$, $HfO_2$ and $ZrO_2$, (iii) vapor phase deposition (PVD) (such as sputtering for $SiO_2$), or (iv) anodization after a PVD process (such as for $Al_2O_3$ or $Ta_2O_5$).

Figure 6:
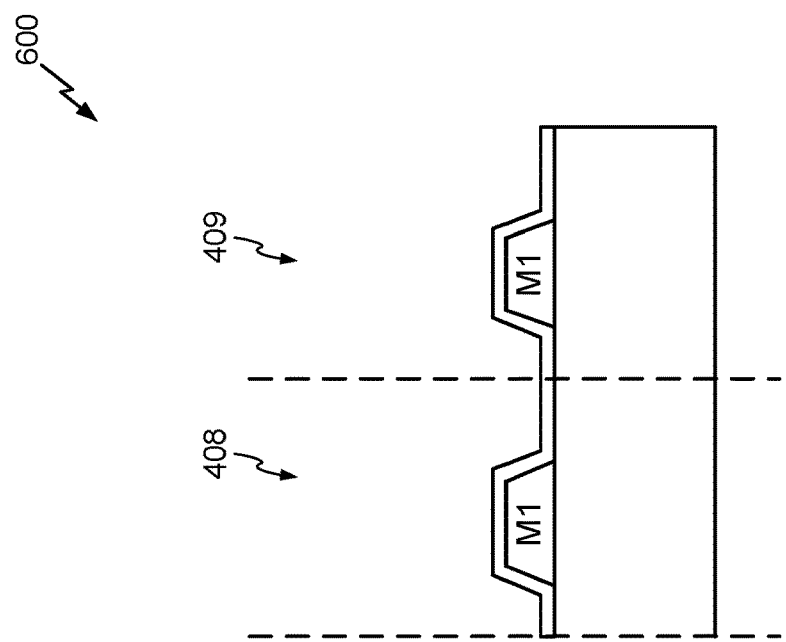
FIG. 6 is a diagram of a third illustrative diagram of a structure during at least one stage in the process of fabricating a semiconductor device.
Figure 6:
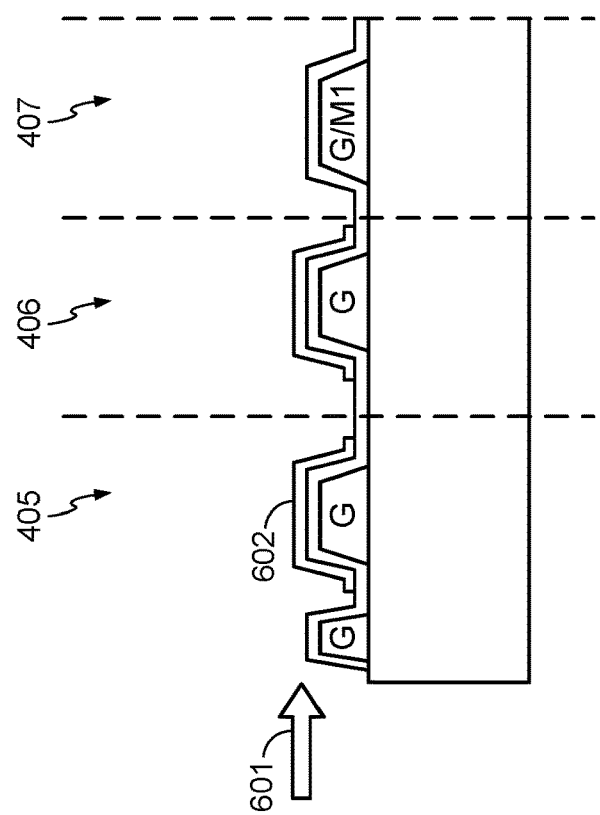

Referring to FIG. 6, a third illustrative diagram of a structure formed during at least one stage in the process of fabricating a semiconductor device is depicted and generally designated 600. In FIG. 6, after the insulation layer 501 is formed, a layer 601 is formed above the substrate 403 to form channel regions 602. In a particular embodiment, the layer 601 is composed of amorphous silicon, polycrystalline silicon, continuous-grain silicon, indium gallium zinc oxide (IGZO), molybdenum disulfide ($MoS_2$), or graphene. The layer 601 may be formed using an additive process, such as plasma-enhanced chemical vapor deposition (PE-CVD), or sputtering. A photolithography-etch process may be used to pattern the layer 601 to form the channel regions 602.

Figure 7:
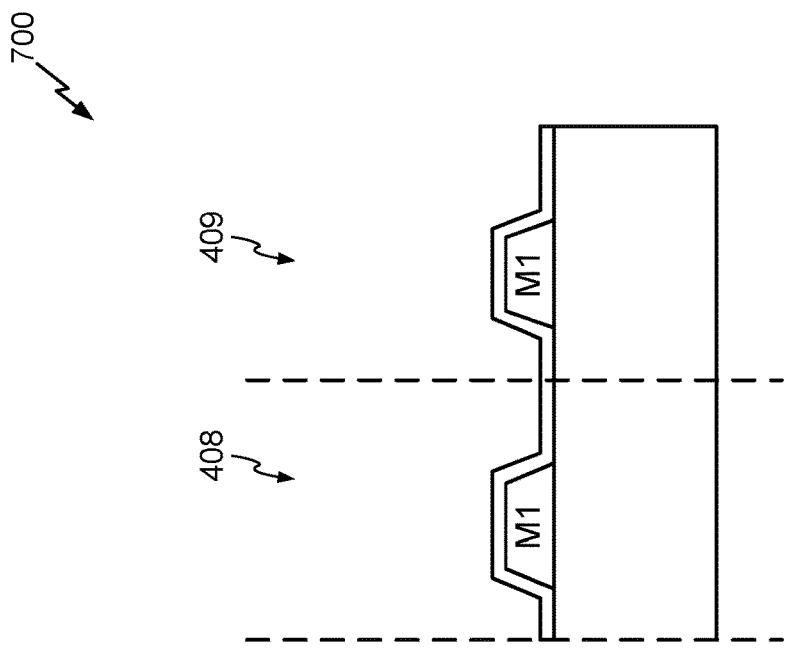
FIG. 7 is a diagram of a fourth illustrative diagram of a structure during at least one stage in the process of fabricating a semiconductor device.
Figure 7:
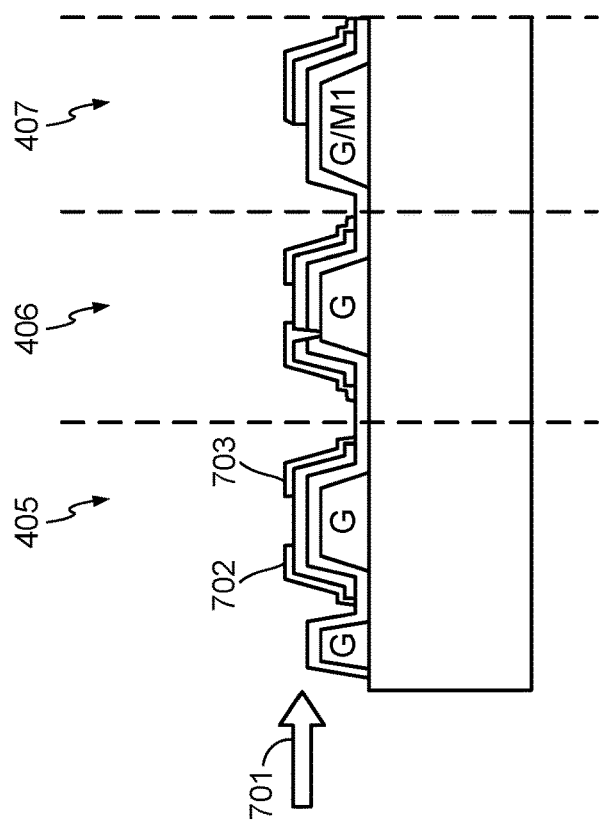

Referring to FIG. 7, a fourth illustrative diagram of a structure formed during at least one stage in the process of fabricating a semiconductor device is depicted and generally designated 700. In FIG. 7, after the channel regions 602 are formed, a layer 701 is formed above the substrate 403 to form source regions 702 and drain regions 703. In a particular embodiment (e.g., when the channel 601 is composed of amorphous-silicon), the layer 701 is composed of impurity doped-amorphous silicon. The layer 701 may be formed using an additive process, such as plasma-enhanced chemical vapor deposition (PE-CVD). A photolithography-etch process may be used to pattern the layer 701 to form the source regions 702 and the drain regions 703.

Figure 8:
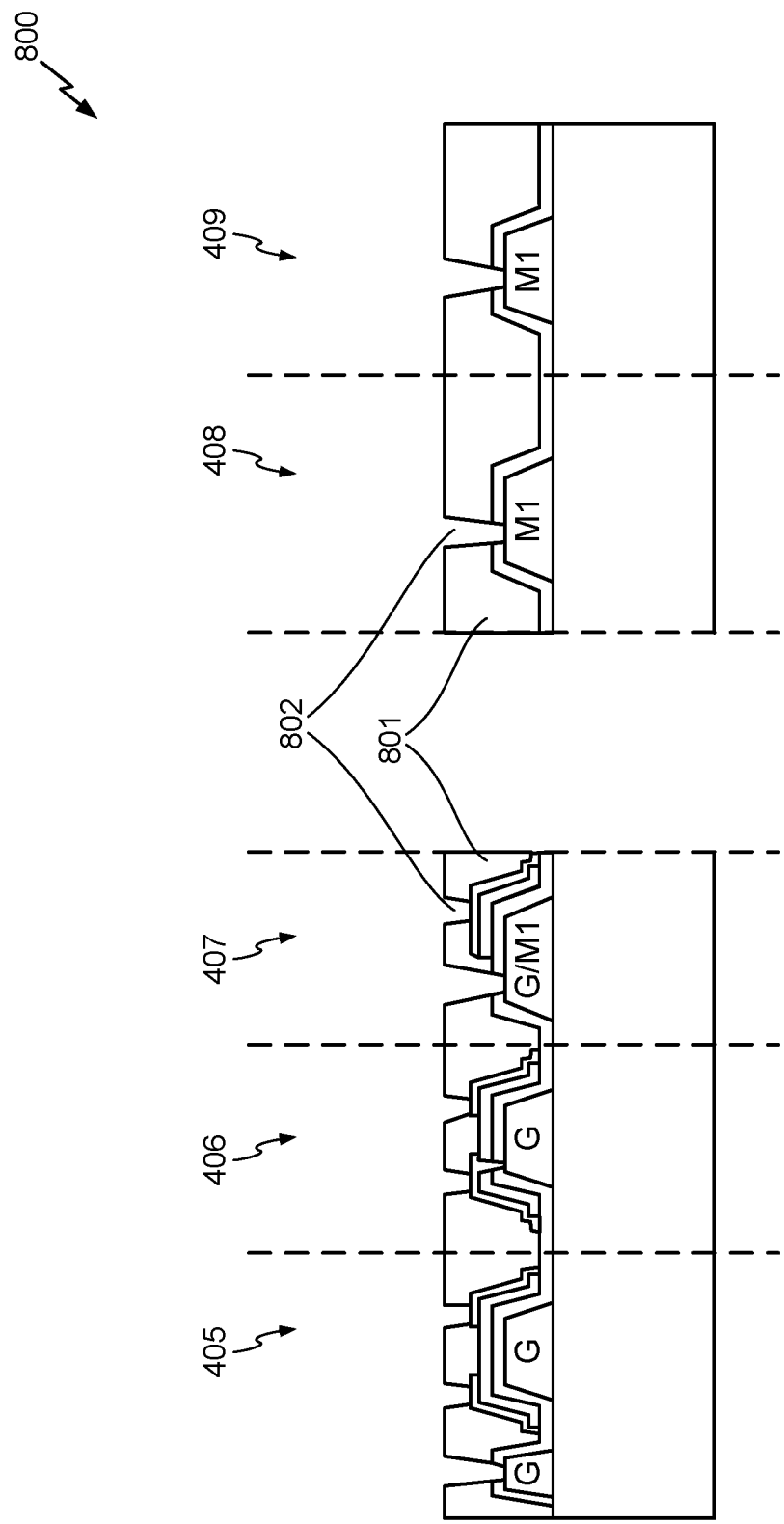
FIG. 8 is a diagram of a fifth illustrative diagram of a structure during at least one stage in the process of fabricating a semiconductor device.

Referring to FIG. 8, a fifth illustrative diagram of a structure formed during at least one stage in the process of fabricating a semiconductor device is depicted and generally designated 800. In FIG. 8, after the source regions 702 and the drain regions 703 are formed, a dielectric layer 801 is formed above the substrate 403 to electrically insulate the TFT of the replica circuit and metal connectors from other circuitry or devices. The dielectric layer 801 may include silicon dioxide ($SiO_2$), silicon nitride ($Si_3N_4$), or insulating polymers, such as polyimide (PI), benzocyclobuenete (BCB), or acrylic. In a particular embodiment, the thickness of the dielectric layer 801 is about 3 μm. An anisotropic etch process may be used to create vias (or recesses) 802 in the dielectric layer 801. The vias (or recesses) 802 may be used to form inductors, gate electrodes, source electrodes, or drain electrodes. In a particular embodiment, the depth of the vias (or recesses) 802 is about 2 μm.

Figure 9:
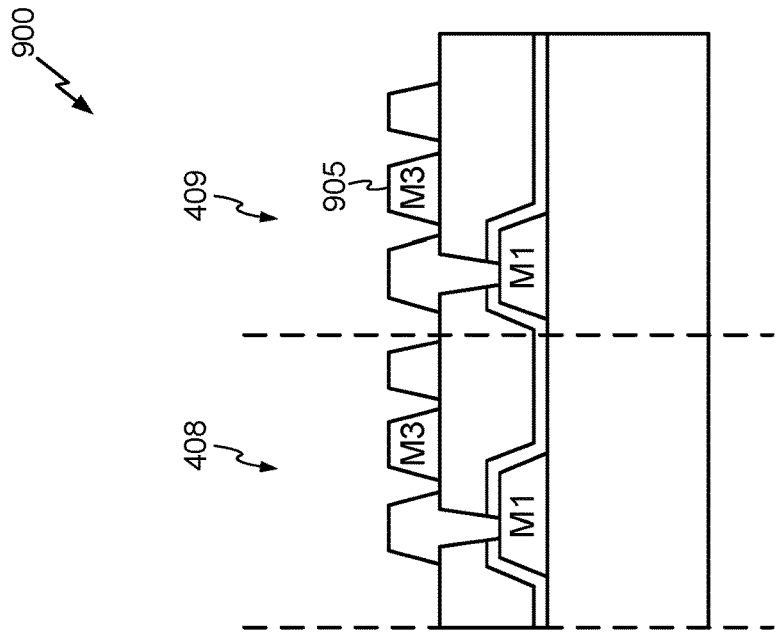
FIG. 9 is a diagram of a sixth illustrative diagram of a structure during at least one stage in the process of fabricating a semiconductor device.
Figure 9:
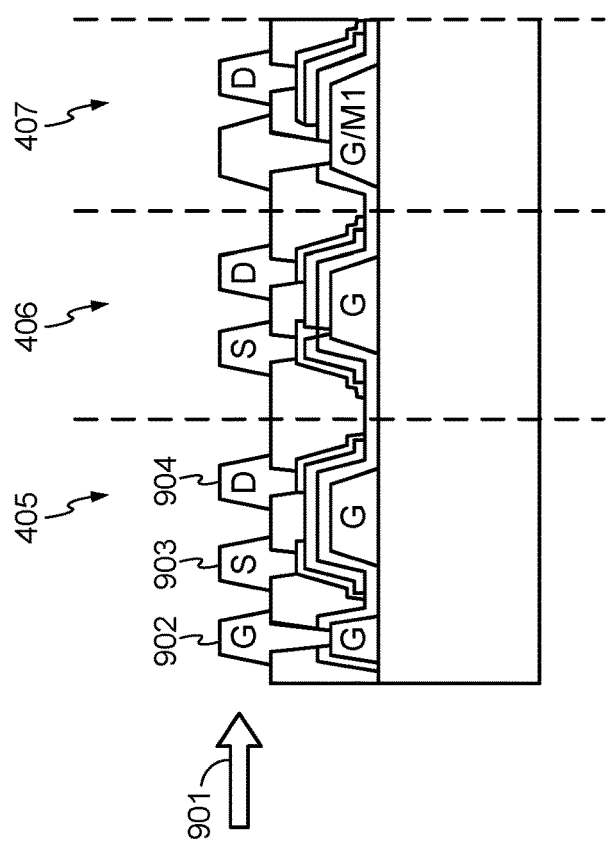

Referring to FIG. 9, a sixth illustrative diagram of a structure formed during at least one stage in the process of fabricating a semiconductor device is depicted and generally designated 900. In FIG. 9, after the vias (or recesses) 802 are formed, a conductive layer 901 is formed above the substrate 403 to form gate electrodes 902, source electrodes 903, drain electrodes 904, and first inductors 905. In a particular embodiment, the conductive layer 901 is made of a metal (such as copper (Cu), aluminum (Al), or gold (Au)) or a metal alloy. The conductive layer 901 may be formed using an additive process, such as chemical vapor deposition (CVD), sputtering, and electroplating. A photolithography-etch process may be used to pattern the conductive layer 901 to form the gate electrodes 902, source electrodes 903, drain electrodes 904, and first inductors 905.

Figure 10:
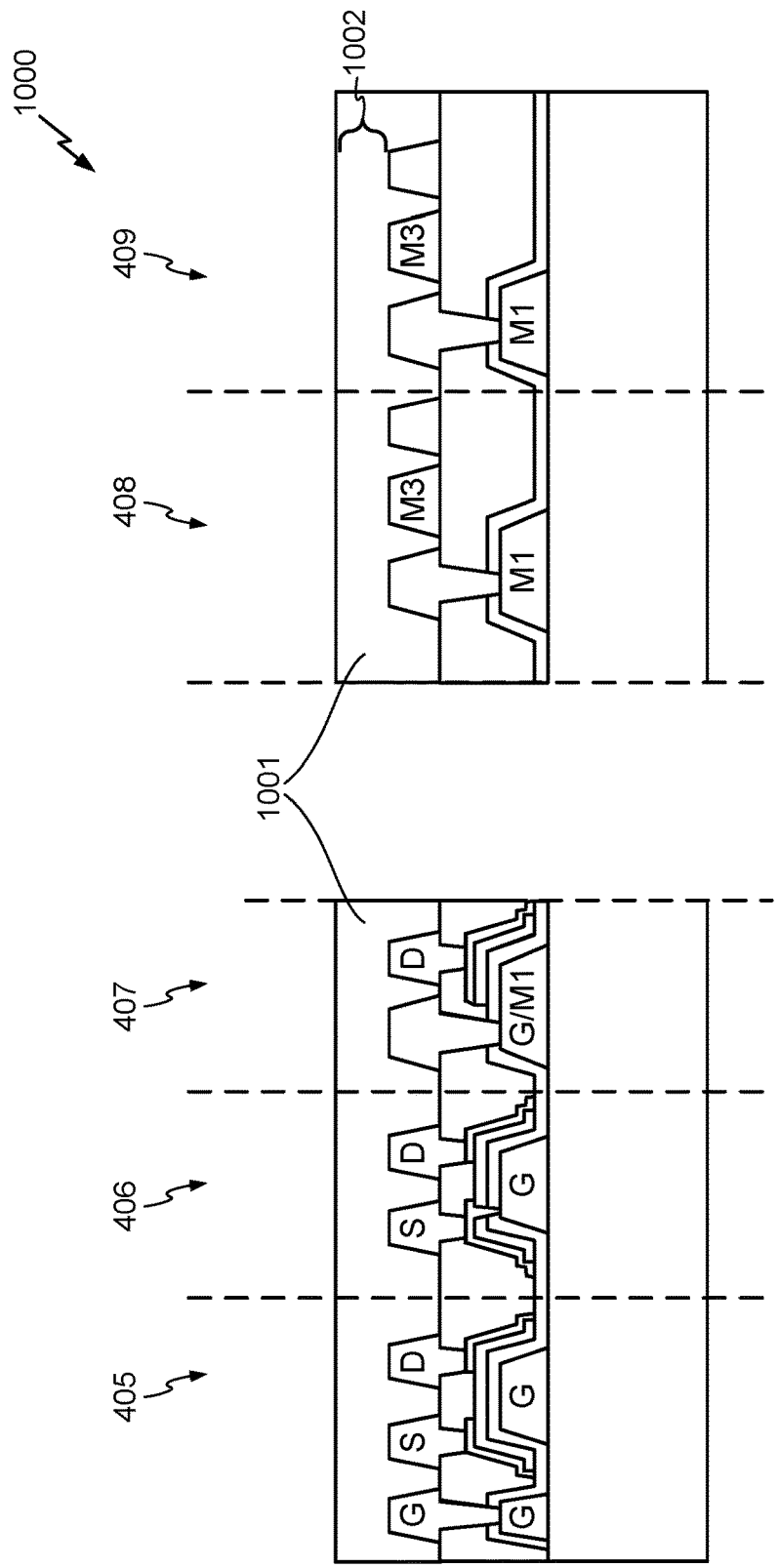
FIG. 10 is a diagram of a seventh illustrative diagram of a structure during at least one stage in the process of fabricating a semiconductor device.

Referring to FIG. 10, a seventh illustrative diagram of a structure formed during at least one stage in the process of fabricating a semiconductor device is depicted and generally designated 1000. In FIG. 10, after the gate electrodes 902, source electrodes 903, drain electrodes 904, and first inductors 905 have been formed, a dielectric layer 1001 is deposited above the substrate 403. The dielectric layer 1001 may insulate the gate electrodes 902, the source electrodes 903, the drain electrodes 904, and the first inductors 905 from other circuitry or devices. A dielectric layer 1002 may be formed between lower inductors in a vertical-coupling hybrid transformer (VHT) and subsequently formed upper inductors in a VHT. In order to enhance transmit-receive (TX-RX) isolation, but not to sacrifice antenna-to-receiver (ANT-RX) coupling efficiency, the dielectric layer 1001 may be composed of a material which has a low dielectric constant (k). This may create a small coupling capacitance while maintaining magnetic coupling between the second inductors (not shown in FIG. 10) and the first inductors 905. In a particular embodiment, materials of the dielectric layer 1001 may include polyimide (PI), polybenzoxazole (PBO), acrylic, zeolitic imidazolate framework material (ZIF), and benzocyclbutene (BCB). The dielectric layer 1001 may be formed using an additive process, such as spin-on followed by a thermal curing process. In a particular embodiment, the thickness of the dielectric layer 1002 is in the range of about 2 μm to about 7 μm.

Figure 11:
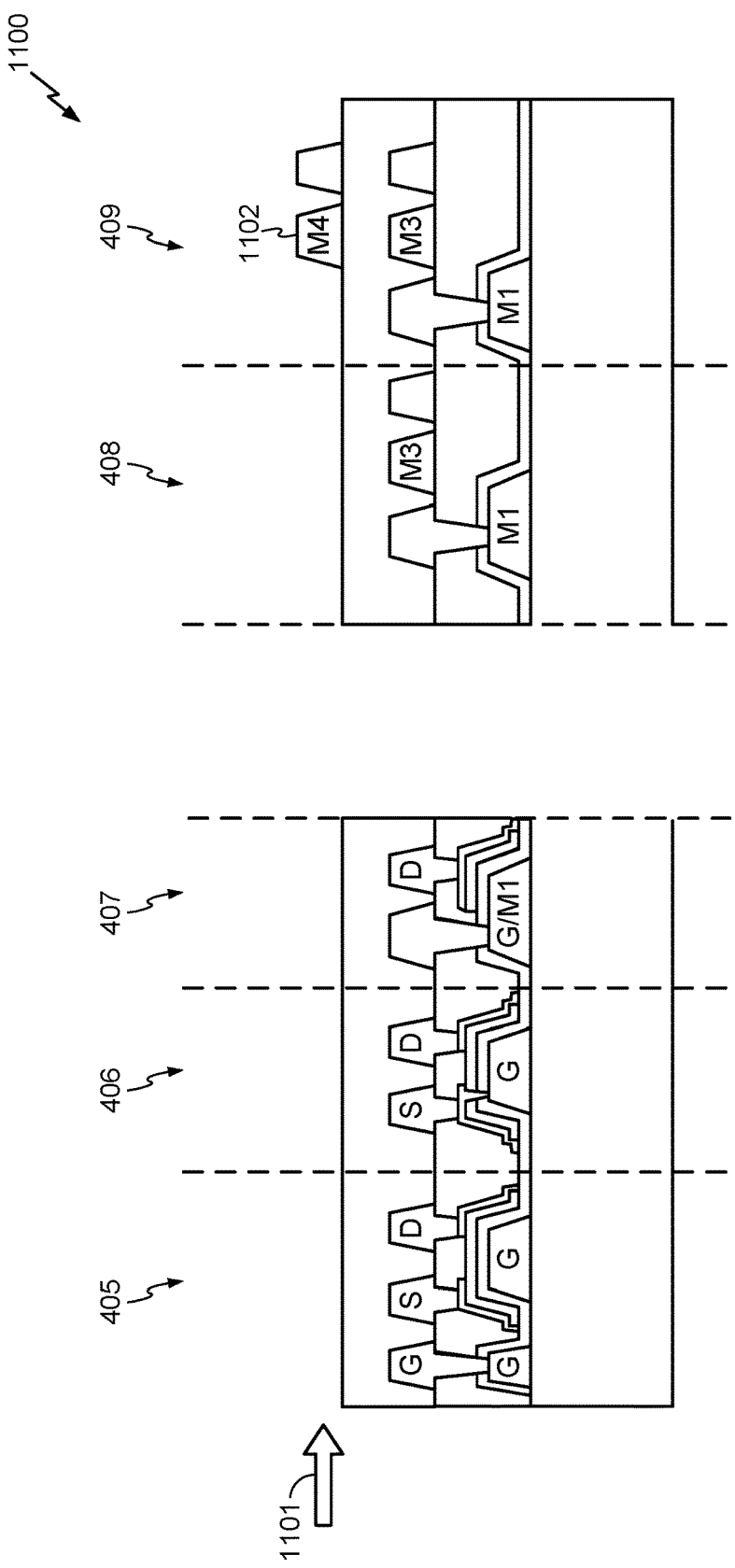
FIG. 11 is a diagram of an eighth illustrative diagram of a structure during at least one stage in the process of fabricating a semiconductor device.

Referring to FIG. 11, an eighth illustrative diagram of a structure formed during at least one stage in the process of fabricating a semiconductor device is depicted and generally designated 1100. In FIG. 11, after the dielectric layer has been formed, a conductive layer 1101 is deposited over the substrate 403 to form second inductors 1102. In a particular embodiment, the conductive layer 1101 is made of a metal, such as copper (Cu), aluminum (Al), or gold (Au), a metal alloy, or a combination thereof. The conductive layer 1101 may be formed using additive processes, such as chemical vapor deposition (CVD), sputtering, and electroplating. A photolithography-etch process may be used to pattern the conductive layer 1101 to form the second inductors 1102. In a particular embodiment, the height of the second inductors 1102 is in the range of about 10 µm to about 15 µm.

Figure 12:
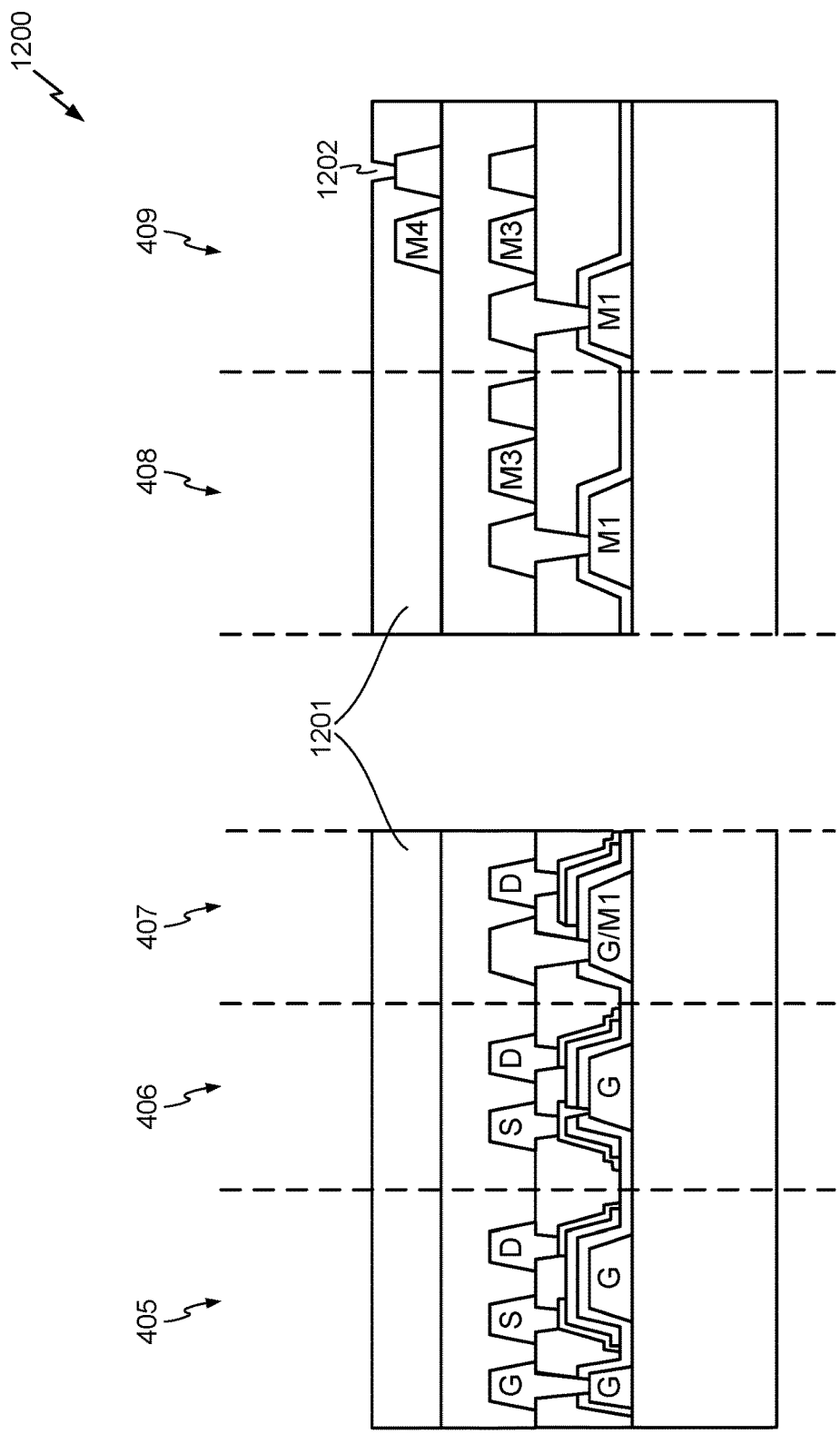
FIG. 12 is a diagram of a ninth illustrative diagram of a structure during at least one stage in the process of fabricating a semiconductor device.

Referring to FIG. 12, a ninth illustrative diagram of a structure formed during at least one stage in the process of fabricating a semiconductor device is depicted and generally designated 1200. In FIG. 12, after the conductive layer 1101 and the second inductors 1102 are formed, a dielectric layer 1201 is deposited above the substrate 403 to insulate the second inductors 1102 from other circuitry or devices. Materials of the dielectric layer 1201 may include polyimide (PI), polybenzoxazole (PBO), acrylic, zeolitic imidazolate framework material (ZIF), or benzocyclbutene (BCB). The dielectric layer 1201 may be formed using an additive processes, such as spin-on coating followed by a thermal curing process. In a particular embodiment, the thickness of the dielectric layer 1201 is about 15 µm. An anisotropic etch process may be used to create recesses 1202 in the dielectric layer 1201. In a particular embodiment, the depth of the recesses 1202 is about 2 µm.

Figure 13:
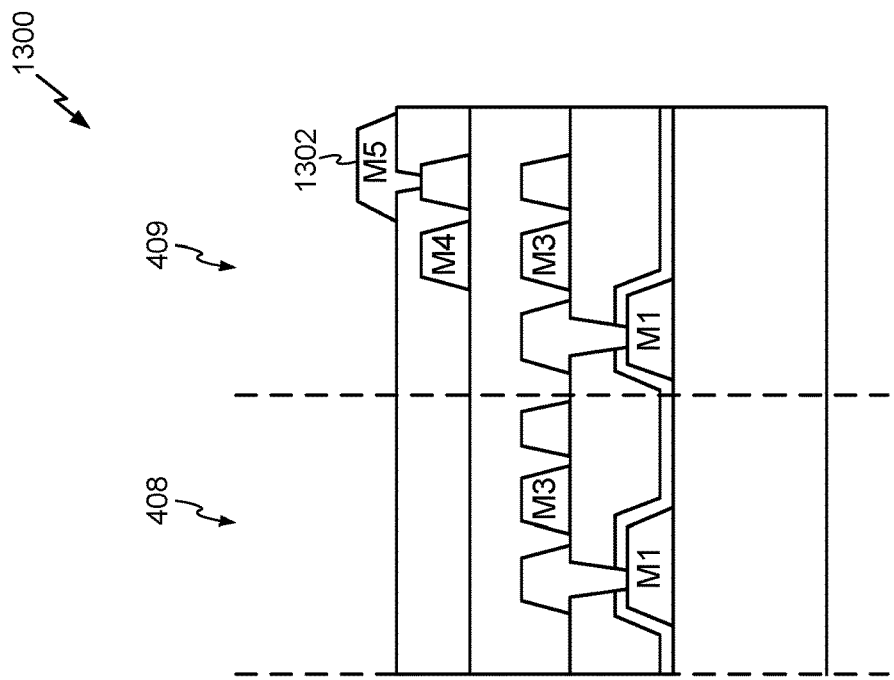
FIG. 13 is a diagram of a tenth illustrative diagram of a structure during at least one stage in the process of fabricating a semiconductor device.
Figure 13:
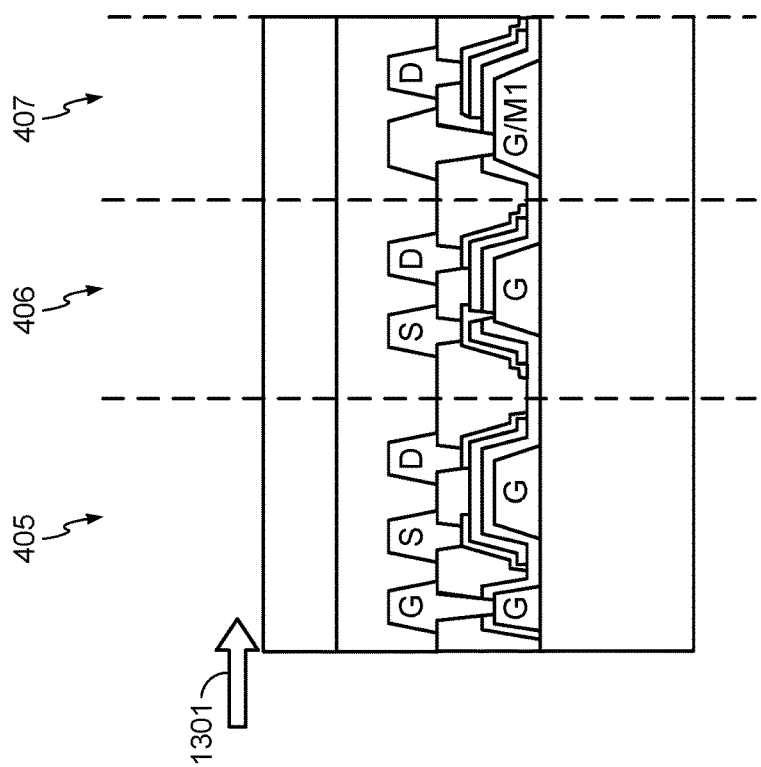

Referring to FIG. 13, a tenth illustrative diagram of a structure formed during at least one stage in the process of fabricating a semiconductor device is depicted and generally designated 1300. In FIG. 13, after the dielectric layer 1201 and recesses 1202 have been created, a conductive layer 1301 is deposited above the substrate 403 to form connectors 1302 that may be used to connect the second inductors 1102 with other circuitry or devices. In a particular embodiment, the conductive layer 1301 is made of a metal, such as aluminum (Al) or copper (Cu), or a metal alloy, such as an aluminum-copper (Al—Cu) alloy. The conductive layer 1301 may be formed through film deposition processes, such as chemical vapor deposition (CVD), sputtering, and electroplating. A photolithography-etch process may be used to pattern the connectors 1302. In a particular embodiment, the thickness of the connectors 1302 is about 3 µm to about 5 µm.

Figure 14:
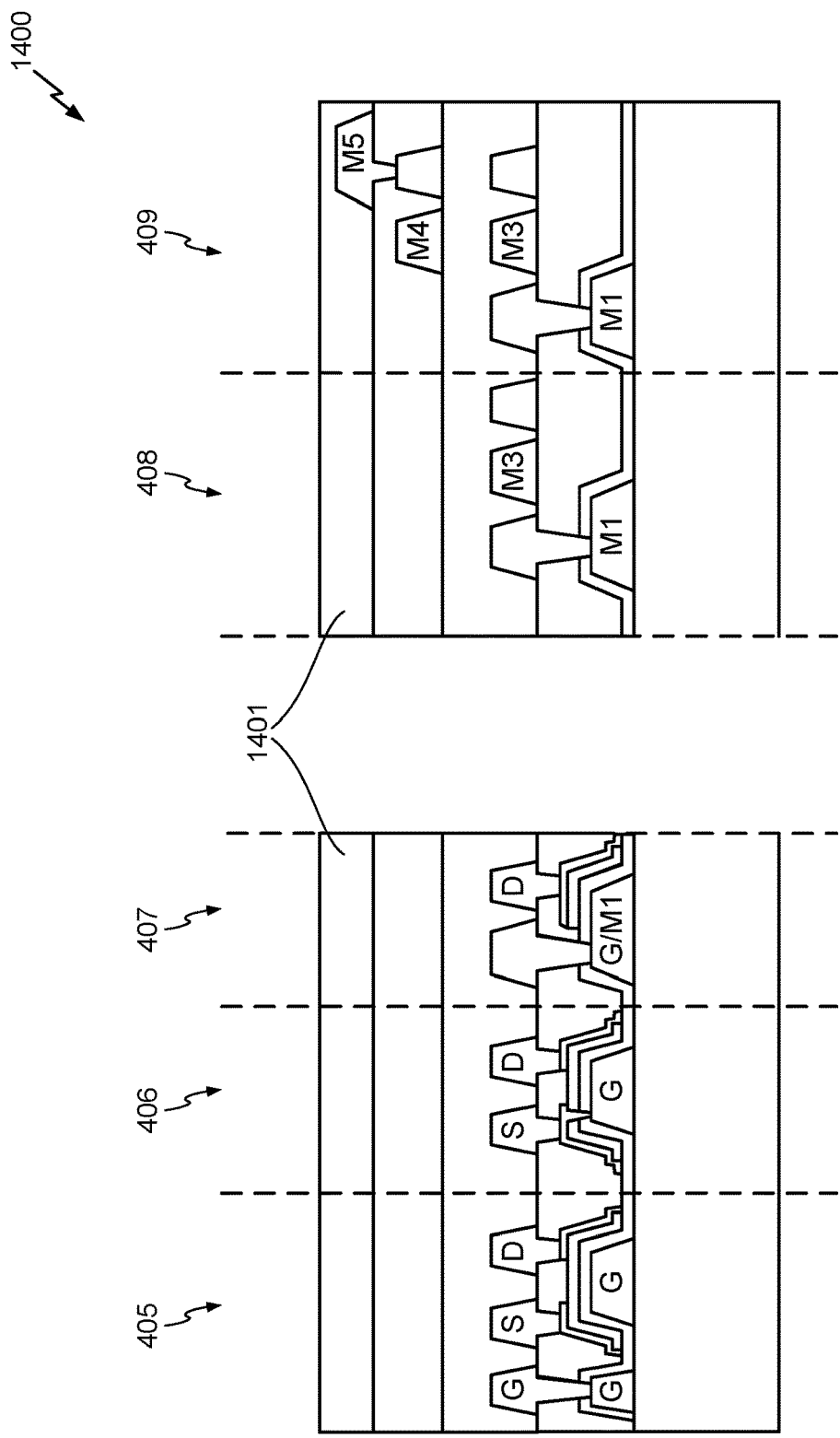
FIG. 14 is a diagram of an eleventh illustrative diagram of a structure during at least one stage in the process of fabricating a semiconductor device.

Referring to FIG. 14, an eleventh illustrative diagram of a structure formed during at least one stage in the process of fabricating a semiconductor device is depicted and generally designated 1400. In FIG. 14, after the conductive layer 1301 is formed and the connectors 1302 are patterned, a passivation layer 1401 may be formed above the substrate 403 to electrically insulate the second inductors 1102 and the connectors 1302 from other circuitry or devices.

The region 405, as shown in FIG. 14, may illustrate a cross section view of a TFT, such as the TFT 115 of FIG. 1. The region 406 as shown in FIG. 14 may illustrate a cross section view of a TFT configured to function as a variable resistor, such as the variable resistor 114 of FIG. 1. The region 407 as shown in FIG. 14 may illustrate a cross section view of a TFT configured to function as a variable capacitor, such as the variable capacitor 113 of FIG. 1. The region 408 as shown in FIG. 14 may illustrate a cross section view of a lateral-coupling hybrid transformer. The region 409 as shown in FIG. 14 may illustrate a cross section view of a vertical-coupling hybrid transformer. The regions 405-409 may be arranged in any configuration that includes at least one transformer and at least one TFT configuration, where the TFT is used as a replica circuit.

Figure 15:
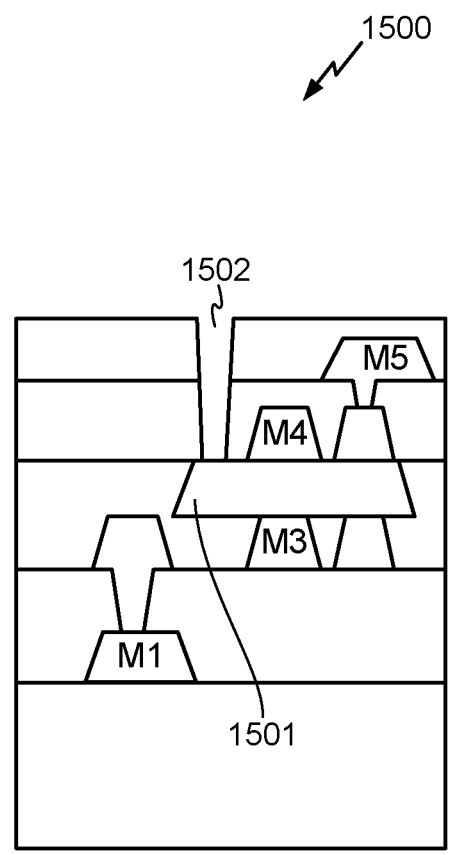
FIG. 15 is a diagram of a twelfth illustrative diagram of a structure during at least one stage in the process of fabricating a semiconductor device.

Referring to FIG. 15, a twelfth illustrative diagram of a structure formed during at least one stage in the process of fabricating a semiconductor device is depicted and generally designated 1500. FIG. 15 shows that the dielectric layer 1002 of FIG. 10 may be replaced by depositing a sacrificial layer 1501. The sacrificial layer 1501 may later be removed to form an air-gap. The air-gap may enhance a transformer's performance (e.g., increased transmit-receive (TX-RX) isolation). The air-gap may enhance antenna-to-receiver (ANT-RX) sensitivity. The air-gap may also reduce transmitter-to-antenna (TX-ANT) and receiver-to-antenna (RX-ANT) insertion loss. In a particular embodiment, materials used in the sacrificial layer 1501 include Molybdenum (Mo), amorphous silicon (a-Si), poly-silicon, silicon dioxide ($SiO_2$), or SU-8 photoresist. In a particular embodiment, the thickness of the sacrificial layer 1501 is about 5 µm.

When the sacrificial layer 1501 has replaced the dielectric layer 1002, after the passivation layer 1401 has been formed, an anisotropic etch process may be performed to create recesses 1502 in the dielectric layer 1201 and the passivation layer 1401. The recesses 1502 may be used as release holes to remove the sacrificial layer 1501 to form air-gaps.

Figure 16:
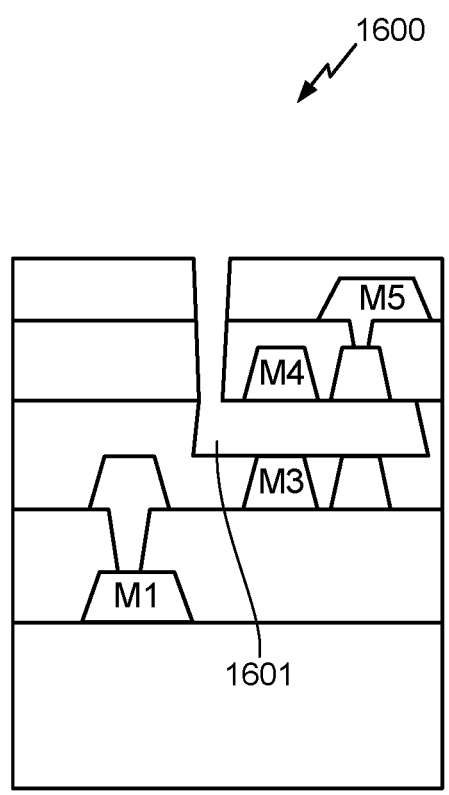
FIG. 16 is a diagram of a thirteenth illustrative diagram of a structure during at least one stage in the process of fabricating a semiconductor device.

Referring to FIG. 16, a thirteenth illustrative diagram of a structure formed during at least one stage in the process of fabricating a semiconductor device is depicted and generally designated 1600. In FIG. 16, after the recesses 1502 are created, the sacrificial layer 1501 may be removed. When the sacrificial layer 1501 is removed, an air-gap 1601 is formed between the second inductors 1102 and the first inductors 905.

In a particular embodiment, a different processing technique, such as a damascene process, may be used to form the first inductors 905, the second inductors 1102, and the conductive layers 404 and 1301. In a particular embodiment, an array of planar inductors is formed. In another embodiment, an array of spiral inductors is formed. The inductors of the array may be square, circular, octagonal, or may have another shape.

Figure 17:
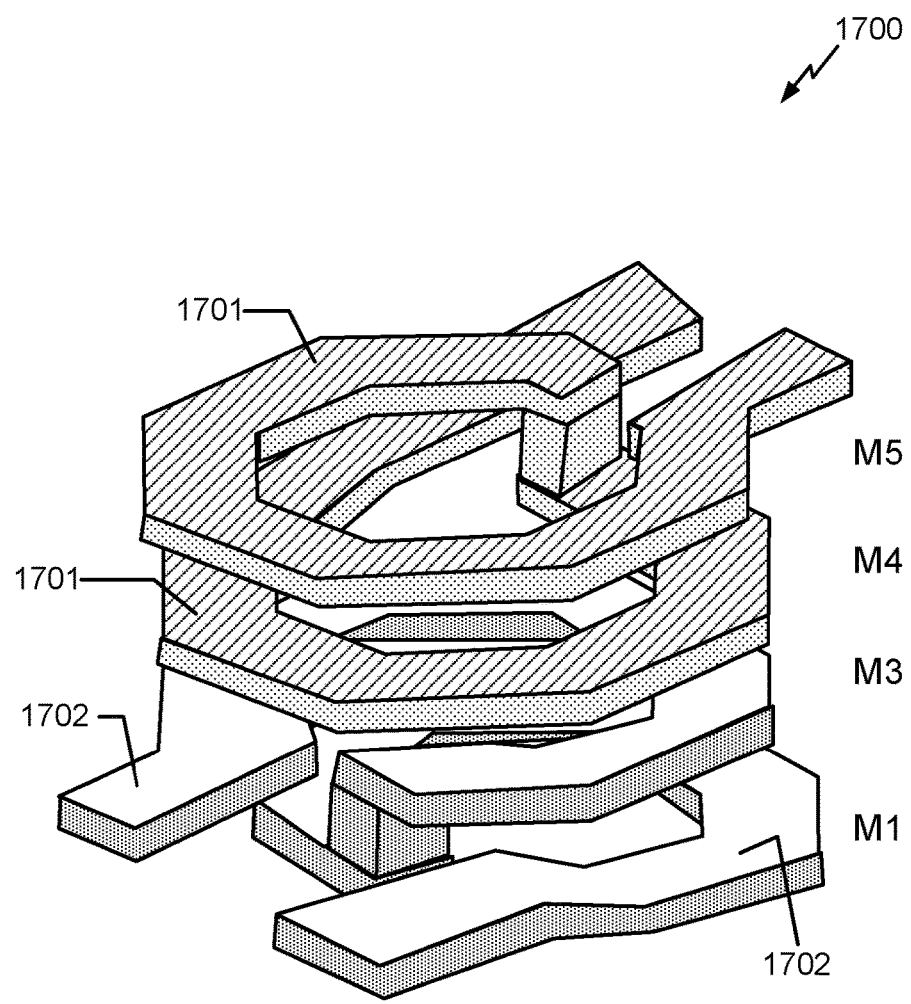
FIG. 17 is a diagram of a particular embodiment of a transformer with multiple inductors in a parallel configuration.

In a particular embodiment, the first inductors 905 and the second inductors 1102 are formed as multiple vertical-coupling inductors in a parallel configuration. The multiple vertical-coupling inductors may include multiple sets of two vertical-coupling inductors. Referring to FIG. 17, a particular illustrative embodiment of a vertical-coupling hybrid transformer (VHT) with multiple inductors in a parallel configuration is depicted and generally designated 1700. As illustrated in FIG. 17, the multiple vertical-coupling inductors may include two or more vertical-coupling inductor structures, each of which comprises a series of inductors 1701 and 1702 connected by connectors and in a parallel configuration.

Figure 18:
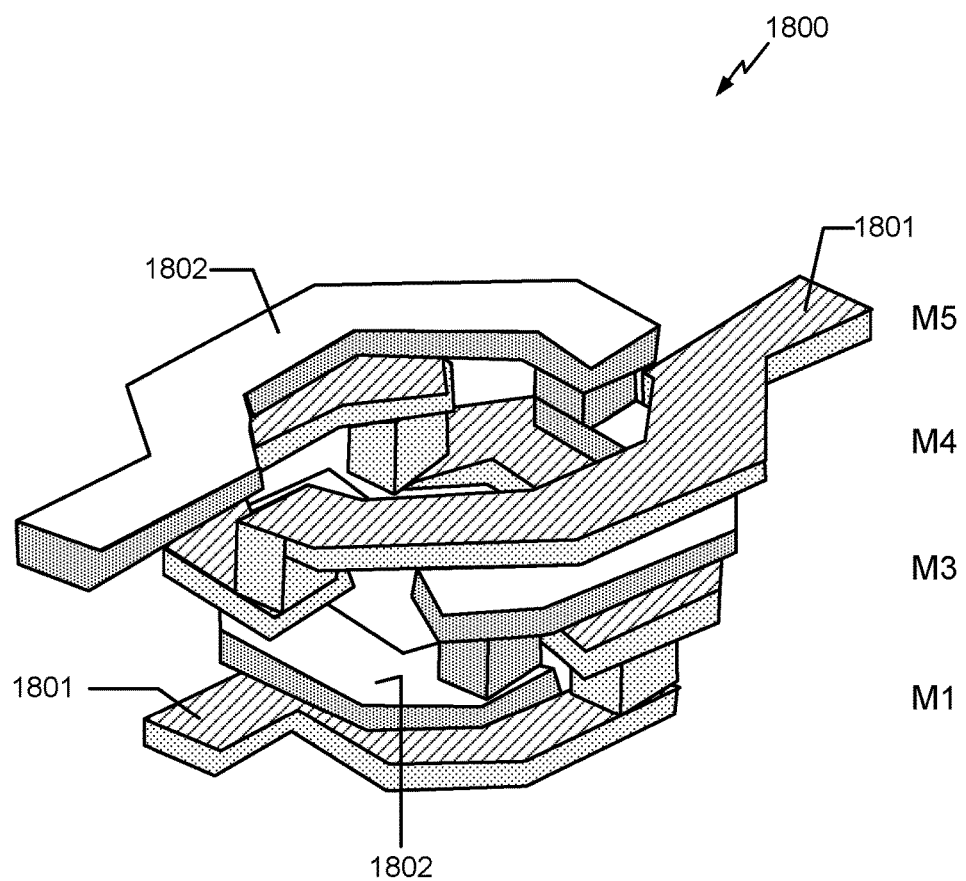
FIG. 18 is a diagram of a particular embodiment of a transformer with multiple inductors in an interleaved configuration.

In a particular embodiment, instead of the parallel configuration, the first inductors 905 and the second inductors 1102 may be formed in an interleaved configuration. Referring to FIG. 18, a particular illustrative embodiment of a vertical-coupling hybrid transformer (VHT) with multiple inductors in an interleave configuration is depicted and generally designated 1800. As illustrated in FIG. 18, in the interleave configuration, the VHT includes a series of inductors of a first type 1801 and a series of inductors of a second type 1802. Each of the inductors of the first type 1801 and the inductors of the second type 1802 corresponds to a portion of an inductor in the parallel configuration. Each inductor of the first type 1801 is paired with and laterally disposed with each inductor of the second type 1802. A combination of one inductor of the first type 1801 and one inductor of the second type 1802 may be referred to as an inductor structure. One inductor structure may be disposed above another inductor structure (e.g., the inductor structures are disposed in parallel). In addition, an inductor of the first type 1801 of a first inductor structure may be connected with an inductor of the first type 1801 of a second inductor structure, where the second inductor structure is disposed above the first inductor structure. Likewise, an inductor of the second type 1802 of the first inductor structure may be connected with an inductor of the second type 1802 of the second inductor structure. The second inductor structure may be disposed above the first inductor structure.

Figure 19:
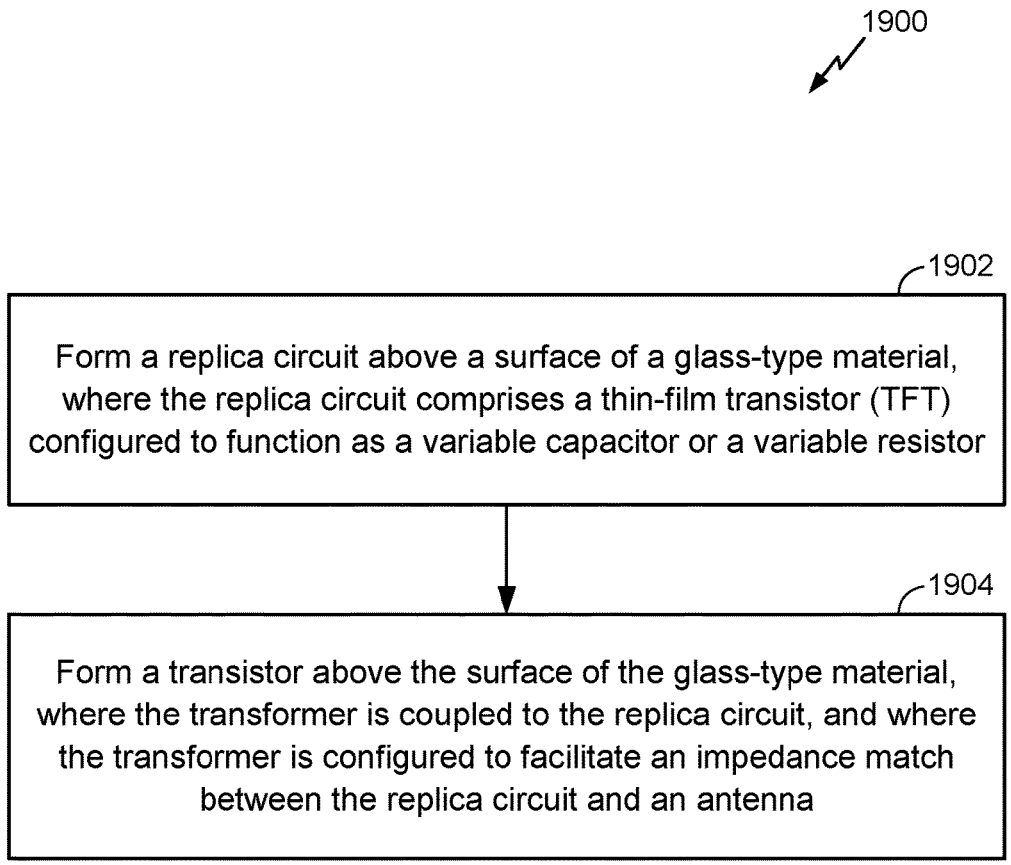
FIG. 19 is a flow chart of a particular illustrative embodiment of a method of forming a replica circuit and a transformer above a surface of a glass-type material.

Referring to FIG. 19, a flow chart of a particular illustrative embodiment of a method of forming a replica circuit and a transformer above a surface of a glass-type material is depicted and generally designated 1900. One or more operations of the method 1900 may be initiated by a processor integrated into an electronic device, such as equipment of a semiconductor manufacturing plant (e.g., a "fab"), as described further with reference to FIG. 21. In a particular embodiment, the method 1900 may be performed to fabricate the structure 100 of FIG. 1, the structure 200 of FIG. 2, or the structure 300 of FIG. 3.

The method 1900 includes forming a replica circuit above a surface of a glass-type material, at 1902. The replica circuit may include a thin-film transistor (TFT) configured to function as a variable capacitor or a variable resistor. For example, as described with reference to FIG. 1, the replica circuit 101 is formed above a surface of the dielectric substrate 103 (e.g., a passive-on-glass (POG) substrate).

The method 1900 further includes, at 1904, forming a transformer above the surface of the glass-type material. The transformer may be coupled to replica circuit. The transformer may be configured to facilitate an impedance match between the replica circuit and an antenna. For example, the replica circuit 101 may be formed side-by-side with the transformer 102 and above the surface of the dielectric substrate 103 of FIG. 1. In another example, the transformer 202 may be formed above the replica circuit 201 and above the surface of the dielectric substrate 203 of FIG. 2. In another example, the replica circuit 301 may be formed above the transformer 302 and above the surface of the dielectric substrate 303 of FIG. 3. The transformer may be a vertical-coupling hybrid (VHT) transformer or a lateral-coupling hybrid transformer.

One or more of the operations described with reference to the method 1900 of FIG. 19 may be initiated by a field-programmable gate array (FPGA) device, an application-specific integrated circuit (ASIC), a processing unit such as a central processing unit (CPU), a digital signal processor (DSP), a controller, another hardware device, a firmware device, or any combination thereof. As an example, the method 1900 of FIG. 19 can be initiated by semiconductor fabrication equipment, such as a processor that executes instructions stored at a memory (e.g., a non-transitory computer-readable medium), as described further with reference to FIG. 21.

Forming the replica circuit and the transformer above a surface of the glass-type material may reduce a trace inductance variation between the replica circuit and the transformer. The trace inductance variation may result in an impedance mismatch between the replica circuit and the antenna, reducing transmit-receive (TX-RX) isolation. Forming the replica circuit and the transformer above a surface of the glass-type substrate may facilitate an impedance match (or a substantial match) between the replica circuit and the antenna, improving TX-RX isolation.

Figure 20:
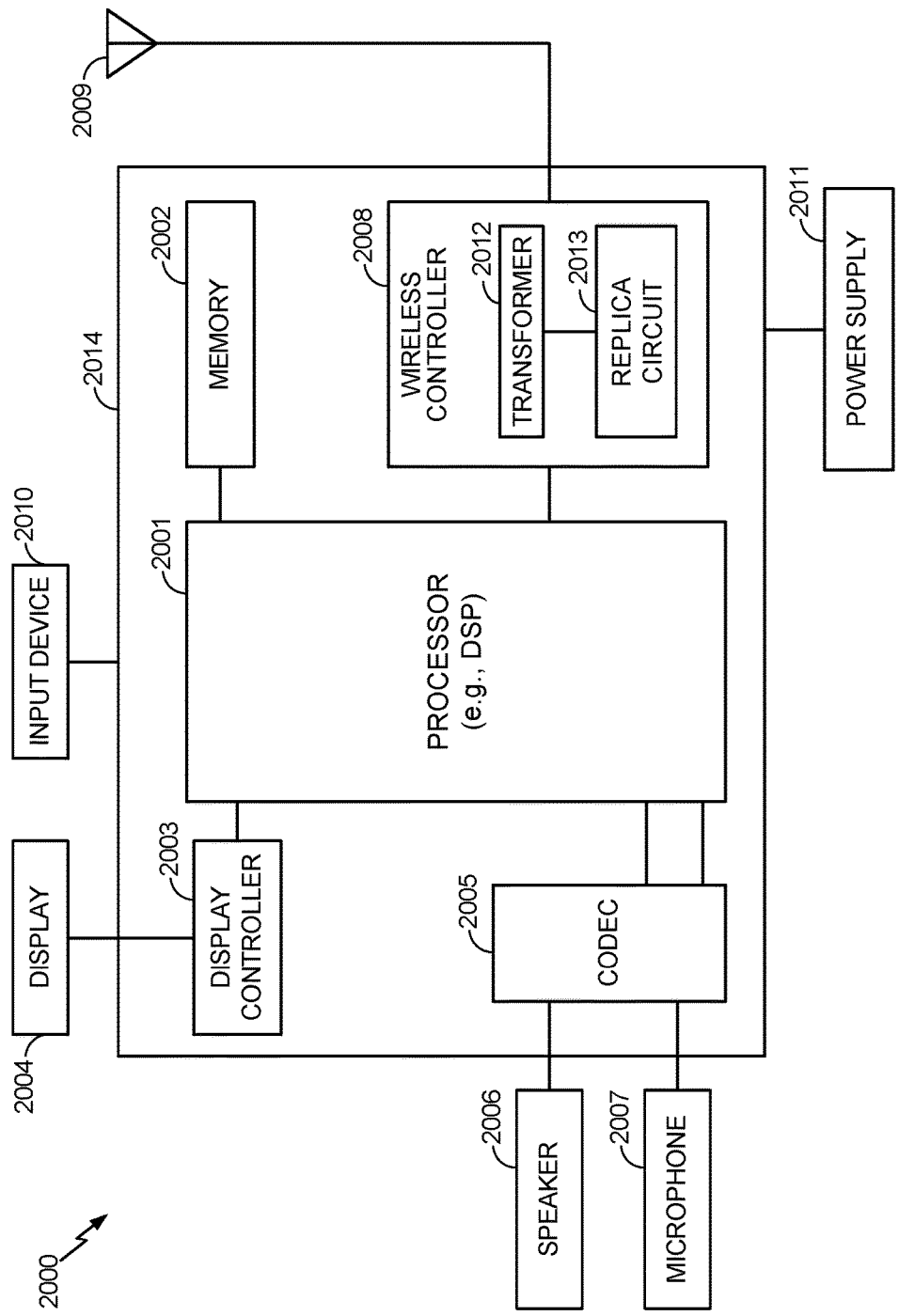
FIG. 20 is a block diagram of a communication device including a replica circuit and a transformer.

Referring to FIG. 20, a block diagram of a particular illustrative embodiment of a mobile device that includes a replica circuit 2013 and a transformer 2012 disposed above a dielectric substrate is depicted and generally designated 2000. The mobile device 2000, or components thereof, may include, implement, or be included within a device such as: a mobile station, an access point, a set top box, an entertainment unit, a navigation device, a communications device, a personal digital assistant (PDA), a fixed location data unit, a mobile location data unit, a mobile phone, a cellular phone, a computer, a portable computer, a desktop computer, a tablet, a monitor, a computer monitor, a television, a tuner, a radio, a satellite radio, a music player, a digital music player, a portable music player, a video player, a digital video player, a digital video disc (DVD) player, or a portable digital video player.

The mobile device 2000 may include a processor 2001, such as a digital signal processor (DSP). The processor 2001 may be coupled to a memory 2002 (e.g., a non-transitory computer-readable medium).

FIG. 20 also shows a display controller 2003 that is coupled to the processor 2001 and to a display 2004. A coder/decoder (CODEC) 2005 can also be coupled to the processor 2001. A speaker 2006 and a microphone 2007 can be coupled to the CODEC 2005. A wireless controller 2008 can be coupled to the processor 2001 and can be further coupled to an antenna 2009. The wireless controller 2008 may include the transformer 2012 and the replica circuit 2013. The transformer 2012 may be coupled to the replica circuit 2013. The transformer 2012 and the replica circuit 2013 may improve performance of the wireless controller 2008 by achieving an impedance match (or substantial match) between the replica circuit 2013 and the antenna 2009, improving transmit-receive (TX-RX) isolation of the mobile device 2000. The transformer 2012 and the replica circuit 2013 may correspond to the transformer 102 and the replica circuit 101 of FIG. 1, may correspond to the transformer 202 and the replica circuit 201 of FIG. 2, may correspond to the transformer 302 and the replica circuit 301 of FIG. 3, or may correspond to a combination thereof.

In a particular embodiment, the processor 2001, the display controller 2003, the memory 2002, the CODEC 2005, and the wireless controller 2008 are included in a system-in-package or system-on-chip device 2014. An input device 2010 and a power supply 2011 may be coupled to the system-on-chip device 2014. Moreover, in a particular embodiment, and as illustrated in FIG. 20, the display 2004, the input device 2010, the speaker 2006, the microphone 2007, the antenna 2009, and the power supply 2011 are external to the system-on-chip device 2014. However, each of the display 2004, the input device 2010, the speaker 2006, the microphone 2007, the antenna 2009, and the power supply 2011 can be coupled to a component of the system-on-chip device 2014, such as an interface or a controller.

In conjunction with the described embodiments, a device includes means for impedance matching coupled to means for transferring energy. The means for impedance matching may include the replica circuit 101 of FIG. 1, the replica circuit 201 of FIG. 2, or the replica circuit 301 of FIG. 3. The means for transferring energy may include the transformer 102 of FIG. 1, the transformer 202 of FIG. 2, or the transformer 302 of FIG. 3. The means for impedance matching may include a thin film transistor TFT (e.g., the TFT 115 of the replica circuit 101 in FIG. 1) configured to function as a variable capacitor or a variable resistor. The means for transferring energy and the means for impedance matching may be disposed above a dielectric substrate (e.g., the dielectric substrate of FIG. 1, 2, or 3) to facilitate (e.g., substantially achieve) an impedance match between the means for impedance matching and an antenna (e.g., the antenna 112 of FIG. 1).

The foregoing disclosed devices and functionalities may be designed and configured into computer files (e.g. RTL, GDSII, GERBER, etc.) stored on computer-readable media. Some or all such files may be provided to fabrication handlers to fabricate devices based on such files. Resulting products include semiconductor wafers that are then cut into semiconductor dies and packaged into semiconductor chips. The semiconductor chips are then integrated into electronic devices, as described further with reference to FIG. 21.

Figure 21:
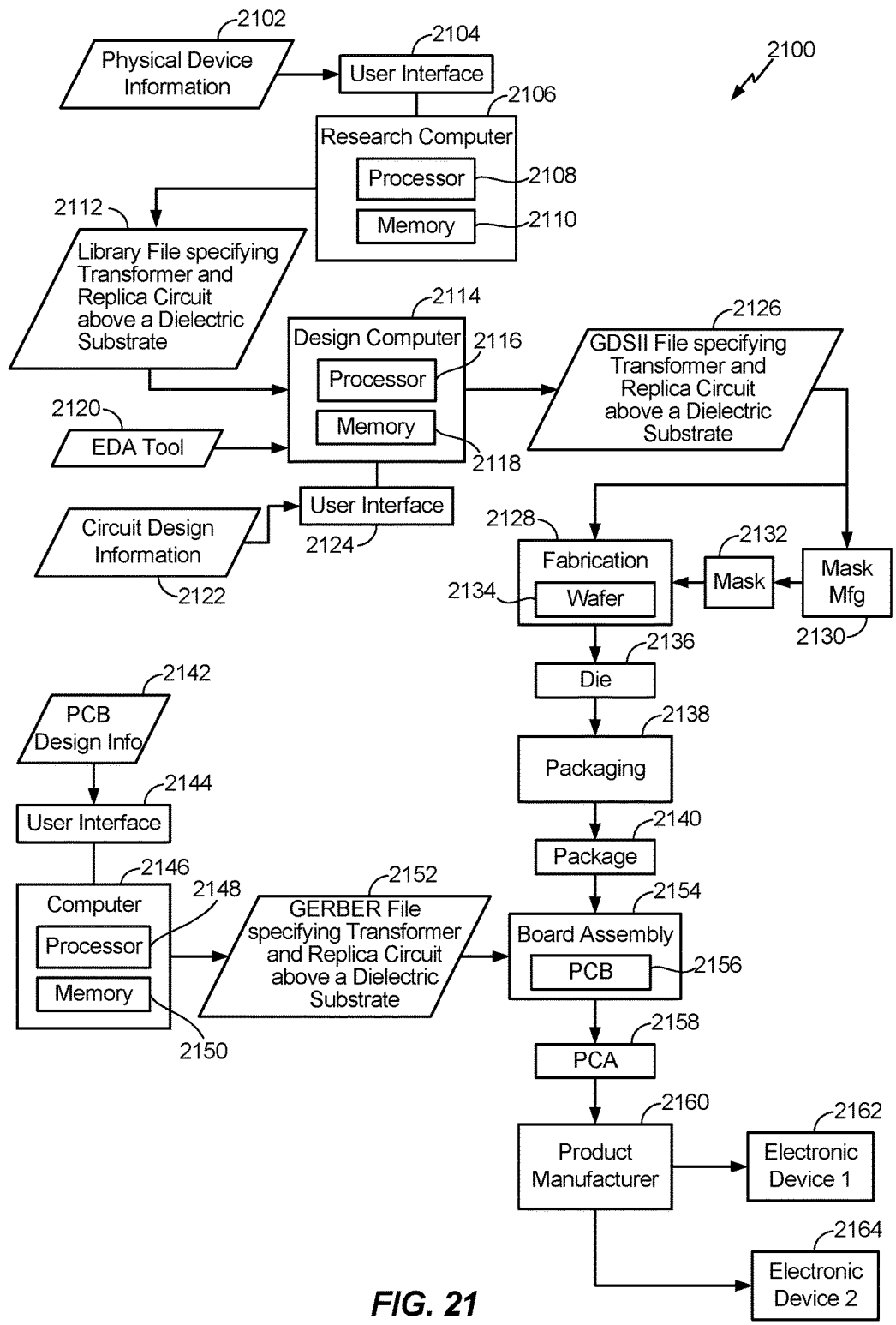
FIG. 21 is a data flow diagram of a particular illustrative embodiment of a manufacturing process to manufacture electronic devices that include a replica circuit and a transformer.

Referring to FIG. 21, a particular illustrative embodiment of an electronic device manufacturing process is depicted and generally designated 2100. In FIG. 21, physical device information 2102 is received at the manufacturing process 2100, such as at a research computer 2106. The physical device information 2102 may include design information representing at least one physical property of a semiconductor device, such as a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof). For example, the physical device information 2102 may include physical parameters, material characteristics, and structure information that is entered via a user interface 2104 coupled to the research computer 2106. The research computer 2106 includes a processor 2108, such as one or more processing cores, coupled to a computer-readable medium such as a memory 2110. The memory 2110 may store computer-readable instructions that are executable to cause the processor 2108 to transform the physical device information 2102 to comply with a file format and to generate a library file 2112.

In a particular embodiment, the library file 2112 includes at least one data file including the transformed design information. For example, the library file 2112 may include a library of semiconductor devices, including a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof), provided for use with an electronic design automation (EDA) tool 2120.

The library file 2112 may be used in conjunction with the EDA tool 2120 at a design computer 2114 including a processor 2116, such as one or more processing cores, coupled to a memory 2118. The EDA tool 2120 may be stored as processor executable instructions at the memory 2118 to enable a user of the design computer 2114 to design a circuit including the transformer and the replica circuit disposed above the dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof), using the library file 2112. For example, a user of the design computer 2114 may enter circuit design information 2122 via a user interface 2124 coupled to the design computer 2114. The circuit design information 2122 may include design information representing at least one physical property of a semiconductor device, such as a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof). To illustrate, the circuit design property may include identification of particular circuits and relationships to other elements in a circuit design, positioning information, feature size information, interconnection information, or other information representing a physical property of a semiconductor device.

The design computer 2114 may be configured to transform the design information, including the circuit design information 2122, to comply with a file format. To illustrate, the file formation may include a database binary file format representing planar geometric shapes, text labels, and other information about a circuit layout in a hierarchical format, such as a Graphic Data System (GDSII) file format. The design computer 2114 may be configured to generate a data file including the transformed design information, such as a GDSII file 2126 that includes information describing a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof), in addition to other circuits or information. To illustrate, the data file may include information corresponding to a system-on-chip (SOC) that includes a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof), and that also includes additional electronic circuits and components within the SOC.

The GDSII file 2126 may be received at a fabrication process 2128 to manufacture a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof), and according to transformed information in the GDSII file 2126. For example, a device manufacture process may include providing the GDSII file 2126 to a mask manufacturer 2130 to create one or more masks, such as masks to be used with photolithography processing, illustrated in FIG. 21 as a representative mask 2132. The mask 2132 may be used during the fabrication process to generate one or more wafers 2134, which may be tested and separated into dies, such as a representative die 2136. The die 2136 includes a circuit including a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof).

In conjunction with the described embodiments, a non-transitory computer-readable medium stores instructions that, when executed by a processor, cause the processor to initiate formation of a transformer above a surface of a glass-type material, and to initiate formation of a replica circuit above the surface of the glass-type material. The replica circuit may include a thin-film transistor (TFT) configured to function as a variable capacitor or a variable resistor. The transformer may be coupled to the replica circuit. The transformer and the replica circuit may be disposed above the glass-type material to facilitate (e.g., substantially achieve) an impedance match between the replica circuit and an antenna. For example, equipment of a semiconductor manufacturing plant may initiate the method 1900 of FIG. 19, such as in connection with the fabrication process 2128 and using the GSDII file 2126.

The die 2136 may be provided to a packaging process 2138 where the die 2136 is incorporated into a representative package 2140. For example, the package 2140 may include the single die 2136 or multiple dies, such as a system-in-package (SiP) arrangement. The package 2140 may be configured to conform to one or more standards or specifications, such as Joint Electron Device Engineering Council (JEDEC) standards.

Information regarding the package 2140 may be distributed to various product designers, such as via a component library stored at a computer 2146. The computer 2146 may include a processor 2148, such as one or more processing cores, coupled to a memory 2150. A printed circuit board (PCB) tool may be stored as processor executable instructions at the memory 2150 to process PCB design information 2142 received from a user of the computer 2146 via a user interface 2144. The PCB design information 2142 may include physical positioning information of a packaged semiconductor device on a circuit board, the packaged semiconductor device corresponding to the package 2140 including a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof).

The computer 2146 may be configured to transform the PCB design information 2142 to generate a data file, such as a GERBER file 2152 with data that includes physical positioning information of a packaged semiconductor device on a circuit board, as well as layout of electrical connections such as traces and vias, where the packaged semiconductor device corresponds to the package 2140 including a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof). In other embodiments, the data file generated by the transformed PCB design information may have a format other than a GERBER format.

The GERBER file 2152 may be received at a board assembly process 2154 and used to create PCBs, such as a representative PCB 2156, manufactured in accordance with the design information stored within the GERBER file 2152. For example, the GERBER file 2152 may be uploaded to one or more machines to perform various steps of a PCB production process. The PCB 2156 may be populated with electronic components including the package 2140 to form a representative printed circuit assembly (PCA) 2158.

The PCA 2158 may be received at a product manufacturer 2160 and integrated into one or more electronic devices, such as a first representative electronic device 2162 and a second representative electronic device 2164. As an illustrative, non-limiting example, the first representative electronic device 2162, the second representative electronic device 2164, or both, may be selected from the group of a set top box, a music player, a video player, an entertainment unit, a navigation device, a communications device, a personal digital assistant (PDA), a fixed location data unit, and a computer, into which a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof), are integrated. As another illustrative, non-limiting example, one or more of the electronic devices 2162 and 2164 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 21 illustrates remote units according to teachings of the disclosure, the disclosure is not limited to these illustrated units. Embodiments of the disclosure may be suitably employed in any device which includes active integrated circuitry including memory and on-chip circuitry.

A device that includes a transformer and a replica circuit disposed above a dielectric substrate (e.g., corresponding to the transformer 102, the replica circuit 101, and the dielectric substrate 103 of FIG. 1, corresponding to the transformer 202, the replica circuit 201, and the dielectric substrate 203 of FIG. 2, corresponding to the transformer 302, the replica circuit 301, and the dielectric substrate 303 of FIG. 3, or corresponding to a combination thereof), may be fabricated, processed, and incorporated into an electronic device, as described in the illustrative manufacturing process 2100. One or more aspects of the embodiments disclosed with respect to FIGS. 1-20 may be included at various processing stages, such as within the library file 2112, the GDSII file 2126, and the GERBER file 2152, as well as stored at the memory 2110 of the research computer 2106, the memory 2118 of the design computer 2114, the memory 2150 of the computer 2146, the memory of one or more other computers or processors (not shown) used at the various stages, such as at the board assembly process 2154, and also incorporated into one or more other physical embodiments such as the mask 2132, the die 2136, the package 2140, the PCA 2158, other products such as prototype circuits or devices (not shown), or any combination thereof. Although various representative stages are depicted with reference to FIGS. 1-20, in other embodiments fewer stages may be used or additional stages may be included. Similarly, the process 2100 of FIG. 21 may be performed by a single entity or by one or more entities performing various stages of the manufacturing process 2100.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in memory, such as random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM). The memory may include any form of non-transient storage medium known in the art. An exemplary storage medium (e.g., memory) is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   forming a replica circuit above a surface of a glass-type material of a single dielectric substrate, wherein the replica circuit comprises a thin-film transistor (TFT) configured to function as a variable capacitor or a variable resistor;
   forming a first inductor structure of a transformer above the surface of the glass-type material of the single dielectric substrate;
   forming a second inductor structure of the transformer, the second inductor structure formed using a metal layer deposited above the first inductor structure; and
   using the metal layer, forming one or more of a gate electrode of a transistor, a source electrode of the transistor, or a drain electrode of the transistor,
   wherein the transformer is coupled to the replica circuit, and wherein the transformer is configured to facilitate an impedance match between the replica circuit and an antenna.

2. The method of claim 1, wherein forming the transformer comprises forming a vertical-coupling hybrid transformer.

3. The method of claim 1, wherein the transformer and the replica circuit are disposed side-by-side.

4. The method of claim 1, wherein the transformer is disposed above the replica circuit.

5. The method of claim 1, wherein the replica circuit is disposed above the transformer.

6. The method of claim 1, wherein forming the transformer and forming the replica circuit are initiated by a processor integrated into an electronic device.

7. The method of claim 1, wherein the transformer includes a vertical-coupling hybrid transformer (VHT).

8. The method of claim 1, further comprising forming a dielectric layer of the transformer, the dielectric layer disposed between the first inductor structure and the second inductor structure.

9. An apparatus comprising:
   a memory; and
   a processor configured to access instructions from the memory and to execute the instructions to initiate formation of a replica circuit above a surface of a glass-type material of a single dielectric substrate, wherein the replica circuit comprises a thin-film transistor (TFT) configured to function as a variable capacitor or a variable resistor, the processor further configured to execute the instructions to initiate formation of a first inductor structure of a transformer above the surface of the glass-type material of the single dielectric substrate, to initiate formation of a second inductor structure of the transformer using a metal layer, and to initiate formation, using the metal layer, of one or more of a gate electrode of a transistor, a source electrode of the transistor, or a drain electrode of the transistor, the second inductor structure formed above the first inductor structure, wherein the transformer is coupled to the replica circuit, and wherein the transformer is configured to facilitate an impedance match between the replica circuit and an antenna.

10. The apparatus of claim 9, wherein the processor is further configured to execute the instructions to initiate formation of a first insulating layer in contact with the first inductor structure and to initiate formation of a second insulating layer in contact with the second inductor structure.

11. The apparatus of claim 9, wherein the processor is further configured to execute the instructions to initiate formation of the replica circuit, the first inductor structure, and the second inductor structure based on a GDSII file that indicates the replica circuit, the first inductor structure, and the second inductor structure.

12. A method comprising:
   a first step for forming a replica circuit above a surface of a glass-type material of a single dielectric substrate, wherein the replica circuit comprises a thin-film transistor (TFT) configured to function as a variable capacitor or a variable resistor;
   a second step for forming a first inductor structure of a transformer above the surface of the glass-type material of the single dielectric substrate; and
   a third step for forming, using a metal layer, a second inductor structure above the first inductor structure and one or more of a gate electrode of a transistor, a source electrode of the transistor, or a drain electrode of the transistor, wherein the transformer is coupled to the replica circuit, and wherein the transformer is configured to facilitate an impedance match between the replica circuit and an antenna.

13. The method of claim 12, wherein forming the transformer comprises forming a vertical-coupling hybrid transformer.

14. The method of claim 12, wherein the transformer and the replica circuit are disposed side-by-side.

15. The method of claim 12, wherein the transformer is disposed above the replica circuit.

16. The method of claim 12, wherein the replica circuit is disposed above the transformer.

17. The method of claim 12, wherein forming the transformer and forming the replica circuit are initiated by a processor integrated into an electronic device.

18. The method of claim 12, wherein the first step, the second step, and the third step are initiated by a processor integrated into an electronic device.

* * * * *